United States Patent
Lau et al.

(10) Patent No.: US 12,424,599 B2
(45) Date of Patent: Sep. 23, 2025

(54) FULL-COLOR LIGHT-EMITTING DIODE MICRO-DISPLAY AND THE FABRICATION METHOD THEREOF

(71) Applicant: The Hong Kong University of Science and Technology, Hong Kong (CN)

(72) Inventors: Kei May Lau, Hong Kong (CN); Xu Zhang, Hong Kong (CN); Peian Li, Hong Kong (CN); Longheng Qi, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 490 days.

(21) Appl. No.: 18/051,538

(22) Filed: Nov. 1, 2022

(65) Prior Publication Data
US 2023/0275074 A1 Aug. 31, 2023

Related U.S. Application Data

(60) Provisional application No. 63/314,481, filed on Feb. 28, 2022.

(51) Int. Cl.
*H01L 25/16* (2023.01)
*H01L 23/00* (2006.01)
*H10H 29/14* (2025.01)

(52) U.S. Cl.
CPC ............ *H01L 25/167* (2013.01); *H01L 24/13* (2013.01); *H01L 24/16* (2013.01); *H01L 24/29* (2013.01);
(Continued)

(58) Field of Classification Search
CPC ....... H01L 25/167; H01L 24/13; H01L 24/16; H01L 24/29; H01L 24/73; H01L 24/81; H01L 24/83; H01L 24/92; H10H 29/142
See application file for complete search history.

(56) References Cited

U.S. PATENT DOCUMENTS 9,041,025 B2 5/2015 Lau et al.
9,704,833 B2 7/2017 Kong et al.
(Continued)

OTHER PUBLICATIONS

Y. D. Qi, H. Liang, W. Tang, Z. D. Lu, and K. M. Lau, "Dual wavelength InGaN/GaN multi-quantum well LEDs grown by metalorganic vapor phase epitaxy," J. Cryst. Growth 272(1), 333-340 (2004).

(Continued)

*Primary Examiner* — Mohammad M Choudhry
(74) *Attorney, Agent, or Firm* — S&F/WEHRW

(57) ABSTRACT

A full-color LED micro-display having a plurality of pixels is disclosed. Each pixel includes a first LED comprising a blue/green dual wavelength LED structure for emitting blue light; a second LED comprising the blue/green dual wavelength LED structure for emitting green light; and a third LED comprising a monochrome red LED structure for emitting red light. The blue/green dual wavelength LED structure includes a dual wavelength MQWs active region of a first material with two emission peaks. The dual wavelength MQWs active region includes a first quantum well stack, a second quantum well stack, and a third quantum well stack. The first and the third quantum well stack are configured for generating the blue light, and the second quantum well stack is configured for generating the green light. The monochrome red LED structure further comprises a red emitting MQWs active region of a second material with a second emission peak.

14 Claims, 18 Drawing Sheets

(52) U.S. Cl.
CPC .............. *H01L 24/73* (2013.01); *H01L 24/81* (2013.01); *H01L 24/83* (2013.01); *H01L 24/92* (2013.01); *H10H 29/142* (2025.01); *H01L 24/32* (2013.01); *H01L 2224/13023* (2013.01); *H01L 2224/13109* (2013.01); *H01L 2224/13111* (2013.01); *H01L 2224/13144* (2013.01); *H01L 2224/13147* (2013.01); *H01L 2224/16145* (2013.01); *H01L 2224/2919* (2013.01); *H01L 2224/32145* (2013.01); *H01L 2224/73204* (2013.01); *H01L 2224/81039* (2013.01); *H01L 2224/832* (2013.01); *H01L 2224/92125* (2013.01)

(56) References Cited

U.S. PATENT DOCUMENTS

| | | | |
|---|---|---|---|
| 9,818,915 | B2 | 11/2017 | Lee et al. |
| 9,865,577 | B2 | 1/2018 | Bibl et al. |
| 10,263,138 | B2 | 4/2019 | Lu |
| 10,325,893 | B2 | 6/2019 | Chong et al. |
| 10,381,335 | B2 | 8/2019 | Sasaki et al. |
| 10,861,398 | B2 | 12/2020 | El-Ghoroury |
| 10,862,010 | B2 | 12/2020 | Bonar et al. |
| 10,902,771 | B2 | 1/2021 | Shin et al. |
| 10,943,532 | B2 | 3/2021 | Lau et al. |
| 10,985,143 | B2 | 4/2021 | Bower et al. |
| 2016/0204306 | A1* | 7/2016 | Ma ..................... H01S 5/3095 438/47 |
| 2022/0052222 | A1* | 2/2022 | Chen ................... H10H 29/142 |

OTHER PUBLICATIONS

H. S. El-Ghoroury, M. Yeh, J. C. Chen, X. Li, and C. Chuang, "Growth of monolithic full-color GaN-based LED with intermediate carrier blocking layers," AIP Adv. 6(7), 075316 (2016).

P. Li, H. Li, Y. Yao, H. Zhang, C. Lynsky, K. S. Qwah et al., "Demonstration of high efficiency cascaded blue and green micro-light-emitting diodes with independent junction control," Appl. Phys. Lett. 118(26), 261104 (2021).

T. Xuan, S. Shi, L. Wang, H. Kuo, and R. Xie, "Inkjet-Printed Quantum Dot Color Conversion Films for High-Resolution and Full-Color Micro Light-Emitting Diode Displays," J. Phys. Chem. Lett. 11(13), 5184-5191 (2020).

X. Zhang, L. Qi, W. C. Chong, P. Li, C. W. Tang, and K. M. Lau, "Active matrix monolithic micro-LED full-color micro-display," J. Soc. Inf. Disp. 29(1), 47-56 (2021).

P. Li, X. Zhang, Y. Li, L. Qi, C. W. Tang, and K. M. Lau, "Monolithic full-color microdisplay using patterned quantum dot photoresist on dual-wavelength LED epilayers," J. Soc. Inf. Disp. 29(3), 157-165 (2021).

X. Zhang, L. Qi, W. C. Chong, P. Li, and K. M. Lau, "23-5: Late-News Paper: High-Resolution Monolithic Micro-LED Full-color Micro-display," SID Symposium Digest of Technical Papers 51(1), 339-342 (2020).

K. Yadavalli, C. L. Chuang, and H. S. El-Ghoroury, "Monolithic and heterogeneous integration of RGB micro-LED arrays with pixel-level optics array and CMOS image processor to enable small form-factor display applications," In Optical Architectures for Displays and Sensing in Augmented, Virtual, and Mixed Reality (AR, VR, MR) 11310, 113100Z (2020).

H. Kawanishi, H. Onuma, M. Maegawa, T. Kurisu, T. Ono, S. Akase et al., "High-resolution and high-brightness full-colour "Silicon Display" for augmented and mixed reality," J. Soc. Inf. Disp. 29(1), 57-67 (2021).

* cited by examiner

FULL-COLOR LIGHT-EMITTING DIODE MICRO-DISPLAY AND THE FABRICATION METHOD THEREOF

CROSS-REFERENCE TO RELATED APPLICATIONS

This application claims the benefit of the U.S. Provisional Patent Application No. 63/314,481, filed on Feb. 28, 2022, which is incorporated by reference herein in its entirety.

FIELD OF THE INVENTION

The present disclosure is generally related to a full-color light emitting diode (LED) micro-display, and more particularly, to a full-color LED micro-display with heterogeneous integration of Indium gallium nitride (InGaN) blue/green dual wavelength LEDs and Aluminum gallium indium phosphide (AlGaInP) red LEDs, and the fabrication method thereof.

BACKGROUND OF THE INVENTION

Virtual reality (VR) and augmented reality (AR) devices provide unique immersions and interaction experiences to users. VR/AR technologies have potentials to be applied in the field of education, healthcare, professional training, guidance and entertainment in the near future. Micro-displays having tiny size (e.g., <1 inch) are the most essential devices for VR/AR applications. They have received rapidly growing attentions from the industrial field. Liquid crystal (LC) and organic light-emitting diode (OLED) technologies are widely used in the display of televisions, personal computers, and smartphones; however, both have inevitable disadvantages. VR/AR devices require a high-brightness, while LC-based micro-displays are based on the light modulation and the energy efficiency is low resulting in higher power consumption. Further, the LC technology also has other shortcomings of low contrast ratio and long response time. The OLED micro-displays have self-emissive pixels which have better efficiency and contrast ratio, but the device reliability is still an issue especially working at high-brightness conditions. Inorganic LED technology is a proper alternative instead of OLED. LEDs are self-emissive, high efficiency, high-brightness devices with a long working lifetime. They can provide enough luminance and contrast ratio even for outdoor applications. Therefore, the LED technology has appealed to researchers and engineers as the next generation technology for the micro-displays.

Numerous companies have developed various types of mass-transfer technology to manufacture large size LED displays (e.g., >5 inches). In the mass-transfer technology, micro-LED devices on red, green and blue LED epitaxial wafers are diced into individual LED pixels and are transferred to the display substrate. Typical transfer methods include pick and place using transfer-head, fluid transfer and micro-printing. These approaches theoretically work for LED micro-displays (<1 inch), but actually they are impractical to precisely transfer all LED pixels to ensure 100% correct placement. In fact, the time consumption, cost, and transfer yield are still enormous challenges. To overcome the technical difficulties brought by the mass-transfer, monolithic fabrication of LED micro-displays is a more competitive way. Since the size of micro-displays is tiny, the entire micro-display can be directly fabricated on the original substrate and integrated with a driver integrated circuit (IC). This type of monolithic LED micro-display is mostly monochrome because only one type of single-color LED wafers is used. It is difficult to grow a LED wafer that emits RGB tri-color or white color due to the limitation of material emission properties. To realize full-color, other structures, for example, color conversion patterns or monolithic LED arrays of other color also need to be integrated.

For example, the inventors of the present application previously proposed a full-color LED micro-displays fabricated from a monolithic blue/green dual wavelength LED array and a red Quantum dot (QD) color conversion pattern (see U.S. Pat. No. 10,943,532 B2). The driving of the micro-display could be either passive-matrix or active-matrix. RGB color filters (CFs) are coated on the corresponding pixels for pure color emission. However, the prior work has the problem that the brightness of the micro-display is limited by the performance of red QD, even blue and green pixels providing high brightness.

QD materials are widely used on monolithic LED micro-displays as a color conversion layer for full-color realization. Compared with phosphors, QD materials have narrow emission wavelength and thus a wide color gamut. But the performance of QD materials is still unsatisfactory. Given a very small pixel pitch in micro-displays, the QD patterns must be small enough and the method to form such tiny QD patterns is not mature. Besides, QD materials cannot be too thick considering the light extraction, optical crosstalk, and viewing angle issues. However, the QD material usually has low optical density, because the QD will aggregate at a high concentration. This limits the overall conversion efficiency of the QD layer. When the micro-display operates at high-brightness conditions, the QD degradation is also a severe problem. Instead of color conversion, all inorganic LED micro-displays are preferred because their high efficiency and long working lifetime. The InGaN LED materials have efficient blue and green emission and the AlGaInP LED materials have efficient red emission. The fabrication of a monochrome R/G/B monolithic LED arrays using solely the InGaN LED materials or solely the AlGaInP LED materials will be extremely complicated.

For example, there is proposed a monolithic full-color LED micro-display fabricated based on a tri-color InGaN LED wafer which shows red, green and blue color at different current density (see U.S. Pat. No. 10,861,398 B2). All pixels are identical, and the color is controlled by the driving current. The brightness of each color is adjusted by the on/off duty cycle of the respective pixels. The micro-display system also has pixel-level optics to collimate and directionally modulate the light emitted from the pixels. However, the proposed micro-display has the discrepancy in the red emission, which is extremely weak using InGaN. To balance the luminance of RGB for color mixing, the brightness of the micro-display must be very low, and it cannot satisfy the high-brightness requirement of micro-displays. The driving method may also be overly complicated for controlling both the current and the duty cycle in the same pixel. As there is no CF, the color emitted from the tri-color LEDs is not pure.

In U.S. Pat. No. 9,041,025 B2, the invention describes a monolithic UV LED array integrated with active-matrix (AM) complementary metal oxide semiconductor (CMOS) driver. Solder bumps are deposited at the AM driver side and the LED array is bonded with the driver chip by flip-chip bonding. Red, green, and blue phosphors are filled in a silicon mold and the mold is fixed on the UV LED array as color converters. The problem of this invention is that the method is only practical for large pixels because the phosphor has large particles (in the scale of micrometers). The unabsorbed UV LED source may also be harmful to human eyes. This prevents the use of this method in micro-display applications.

Accordingly, there is a need in the art to have an improved full-color display that eliminates or at least diminishes the disadvantages and problems described above. Furthermore, other desirable features and characteristics will become apparent from the subsequent detailed description and the appended claims, taken in conjunction with the accompanying drawings and this background of the disclosure.

SUMMARY OF THE INVENTION

Provided herein is a full-color LED micro-display with heterogeneous integration of InGaN blue/green dual wavelength LEDs and AlGaInP red LEDs.

In accordance with the first embodiment of the present disclosure, a full-color LED micro-display having a plurality of pixels is disclosed. Each pixel includes a first LED comprising a blue/green dual wavelength LED structure for emitting blue light; a second LED comprising the blue/green dual wavelength LED structure for emitting green light; and a third LED comprising a monochrome red LED structure for emitting red light. The blue/green dual wavelength LED structure includes a dual wavelength MQWs active region of a first material with two emission peaks. The dual wavelength MQWs active region includes a first quantum well stack, a second quantum well stack, and a third quantum well stack. The first and the third quantum well stack are configured for generating the blue light, and the second quantum well stack is configured for generating the green light. The monochrome red LED structure further comprises a red emitting MQWs active region of a second material with a second emission peak.

In certain embodiments, the first material is Indium gallium nitride (InGaN) and the second material is Aluminum gallium indium phosphide (AlGaInP)

In certain embodiments, the first quantum well stack and the third quantum well stack each includes one or more blue emitting quantum wells (QWs) and one or more quantum barrier layers; and the second quantum well stack includes one or more green emitting QWs and one or more quantum barrier layers.

In certain embodiments, the first quantum well stack includes three blue emitting QWs; the second quantum well stack includes one green emitting QW; and the third quantum well stack includes one blue emitting QW.

In certain embodiments, each blue emitting QW is an $In_xGa_{1-x}N$ layer with a first thickness between 1 and 10 nm, wherein x is any value between 0.1 and 0.2. The green emitting QW is an $In_yGa_{1-y}N$ layer with a second thickness between 1 and 5 nm, wherein y is any value between 0.2 and 0.3.

In certain embodiments, the blue/green dual wavelength LED structure further includes a buffer layer comprising an undoped gallium nitride (GaN) layer; an n-doped semiconductor layer comprising a Si-doped n-GaN layer and an InGaN shallow wells; and a p-doped semiconductor layer comprising a Mg-doped p-GaN layer and a Mg-doped p-$In_{0.02}Ga_{0.98}N$ layer stacked above the Mg-doped p-GaN layer.

In certain embodiments, the monochrome red LED structure further includes an n-side layer comprising a Si-doped n-GaAs layer, a Si-doped n-AlGaInP layer, and a Si-doped n-AlInP layer; and a p-side layer comprising a Zn or Mg doped p-AlInP layer and a Zn or Mg doped p-GaP layer. The red emitting MQWs active region is sandwiched between the n-side layer and the p-side layer. The red emitting MQWs active region includes one or more red emitting AlGaInP quantum wells (QWs) sandwiched between two AlGaInP quantum barrier layers.

In certain embodiments, the blue/green dual wavelength LED structure further includes an electron blocking layer (EBL). The EBL further includes one or more magnesium-doped (Mg-doped) $Al_xGa_{1-x}N$ with a magnesium doping concentration between $1\times10^{17}$ cm$^{-3}$ and $1\times10^{20}$ cm$^{-3}$, and $In_yGa_{1-y}N$ layers. Preferably, x is any value between 0.01 and 0.3 and y is any value between 0 and 0.3.

In certain embodiments, the dual wavelength MQWs active region and the red emitting MQWs active region are formed on two different epitaxial layers that are not overlapping vertically.

In certain embodiments, the dual wavelength MQWs active region is positioned at a lower vertical position closer to a substrate layer than the red emitting MQWs active region.

In certain embodiments, the blue/green dual wavelength LED structure further includes an n-doped semiconductor layer and a p-doped semiconductor layer. The monochrome red LED structure further includes an n-side layer and a p-side layer. The dual wavelength MQWs active region is sandwiched between the n-doped semiconductor layer and the p-doped semiconductor layer. The red emitting MQWs active region is sandwiched between the n-side layer and the p-side layer. Preferably, the p-doped semiconductor layer is positioned above the dual wavelength MQWs active region and the n-doped semiconductor layer, and the n-side layer is positioned above the red emitting MQWs active region and the p-side layer.

In certain embodiments, the first LED, the second LED, and the third LED are formed above a driver panel via a plurality of pixel bonding pads. Preferably, the driver panel is a CMOS driving chip, a thin-film transistor (TFT) driving backplane, a gate-in-panel (GIP) circuit, or other driver panels that comprise circuits on a panel substrate.

In certain embodiments, the dual wavelength MQWs active region is positioned at a lower vertical position closer to the driver panel than the red emitting MQWs active region.

In certain embodiments, the blue/green dual wavelength LED structure further includes an n-doped semiconductor layer and a p-doped semiconductor layer. The monochrome red LED structure further comprising an n-side layer and a p-side layer. The dual wavelength MQWs active region is sandwiched between the n-doped semiconductor layer and the p-doped semiconductor layer. The red emitting MQWs active region is sandwiched between the n-side layer and the p-side layer. Preferably, the n-doped semiconductor layer is positioned above the dual wavelength MQWs active region and the p-doped semiconductor layer, and the n-side layer is positioned above the red emitting MQWs active region and the p-side layer.

In accordance with the second embodiment of the present disclosure, a method for fabricating a full-color LED micro-display is provided. The full-color LED micro-display includes a first LED having a blue/green dual wavelength LED structure for emitting blue light, a second LED having the blue/green dual wavelength LED structure for emitting green light, and a third LED comprising a monochrome red LED structure for emitting red light. The method includes (1) forming a first monolithic LED array with the blue/green dual wavelength LED structure on a substrate, including the step of depositing or growing a buffer layer, a first n-doped semiconductor layer, a dual wavelength multiple quantum wells (MQWs) active region of a first material with two emission peaks, an electron blocking layer (EBL), and a p-doped semiconductor layer on the substrate; (2) forming a second monolithic LED array with the monochrome red LED structure on a Gallium arsenide (GaAs) substrate, including the step of depositing or growing an n-side layer, a red emitting MQWs active region of a second material with a second emission peak, and a p-side layer on the GaAs substrate; (3) performing flip-chip bonding to heterogeneously integrating the first monolithic LED array and the second monolithic LED array; and (4) removing the GaAs substrate by performing dry etching, wet etching, or a combination of dry etching and wet etching.

In certain embodiments, the step of forming the first monolithic LED array with the blue/green dual wavelength LED structure further includes (1) applying an etching mask comprising photoresist, silicon dioxide ($SiO_2$), or silicon nitride ($Si_3N_4$); (2) performing etching to remove portions of all epitaxial layers above the substrate to expose the first LED, the second LED, and a multilayer structure, wherein the multilayer structure is provided for accommodating and connecting the third LED to the first monolithic LED array; (3) depositing a current spreading layer (CSL), an n-metal layer, and a p-metal layer respectively on the first and the second LEDs by evaporation or sputtering, wherein the CSL is an indium tin oxide (ITO) or a Ni/Au metal stack; (4) depositing and patterning an n-metal layer respectively on the CSL of the first and the second LEDs; and (5) coating a blue color filter (CF) and a green CF on top of the first LED and the second LED respectively and performing hard-bake.

In certain embodiments, the step of forming the second monolithic LED array with the monochrome red LED structure further includes (1) applying an etching mask comprising photoresist, silicon dioxide ($SiO_2$), or silicon nitride ($Si_3N_4$); (2) performing etching to remove portions of all epitaxial layers above the GaAs substrate to expose the third LED; (3) depositing and patterning a p-metal layer and an n-metal layer on the third LED as a p-electrode and an n-electrode; (4) coating and patterning a passivation layer, wherein the passivation layer is $SiO_2$, $Si_3N_4$, $Al_2O_3$, hard-baked photoresist, organic polymer, or any combination thereof; and (5) depositing and patterning a p-metal bump on the p-metal layer for electrically connecting the third LED to the first monolithic LED array.

In certain embodiments, the step of forming the second monolithic LED array with the monochrome red LED structure further includes the step of depositing or growing an etch stop layer (ESL). Preferably, the ESL is provided for improving etching selectivity when removing the GaAs substrate.

In certain embodiments, the step of performing flip-chip bonding further includes coating an underfill layer on the first and second monolithic LED arrays; and applying a bonding temperature of 150° C. and 300° C. for 0.5 minute to 10 minutes to bond the first and second monolithic LED arrays and cure the underfill layer.

In certain embodiments, the method further includes performing flip-chip bonding the first monolithic LED array on a driver panel; and removing the substrate by performing dry etching, wet etching, or a combination of dry etching and wet etching before performing flip-chip bonding to heterogeneously integrating the first monolithic LED array and the second monolithic LED array. Preferably, the driver panel is a CMOS driving chip, a thin-film transistor (TFT) driving backplane, a gate-in-panel (GIP) circuit, or other driver panels that comprise circuits on a panel substrate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects and advantages of the present invention are disclosed as illustrated by the embodiments hereinafter.

BRIEF DESCRIPTION OF THE DRAWINGS

The appended drawings contain figures to further illustrate and clarify the above and other aspects, advantages, and features of the present disclosure. It will be appreciated that these drawings depict only certain embodiments of the present disclosure and are not intended to limit its scope. It will also be appreciated that these drawings are illustrated for simplicity and clarity and have not necessarily been depicted to scale. The present disclosure will now be described and explained with additional specificity and detail through the use of the accompanying drawings in which.

DETAILED DESCRIPTION OF THE INVENTION

Figure 1:
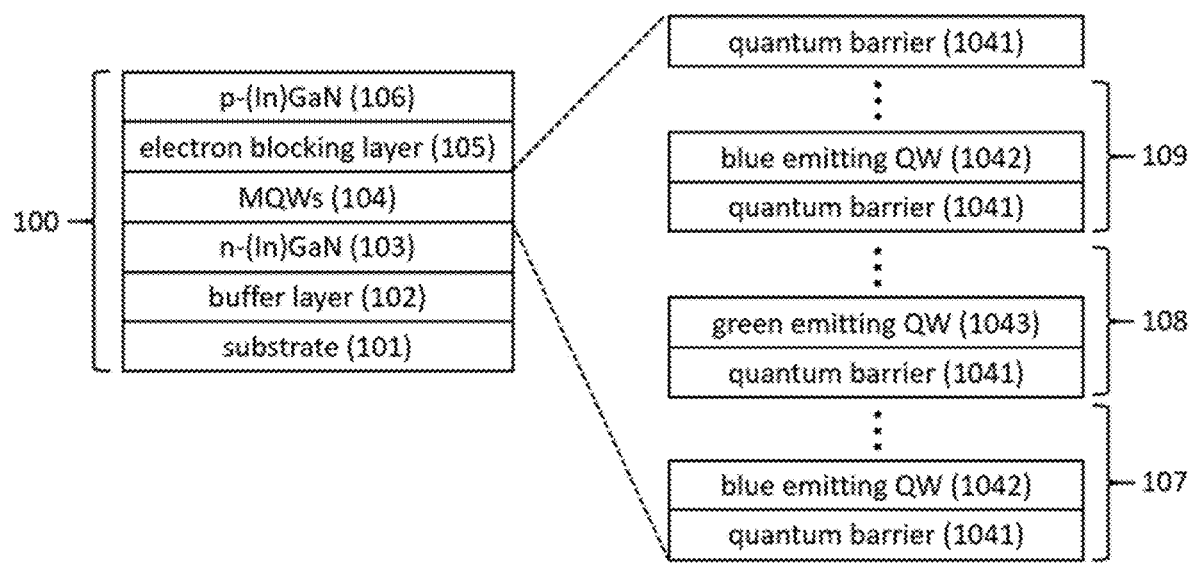
FIG. 1 shows a schematic cross-sectional view of a blue/green dual wavelength LED epitaxial wafer and the multiple quantum well (MQW) active region.

The following detailed description is merely exemplary in nature and is not intended to limit the disclosure or its application and/or uses. It should be appreciated that a vast number of variations exist. The detailed description will enable those of ordinary skilled in the art to implement an exemplary embodiment of the present disclosure without undue experimentation, and it is understood that various changes or modifications may be made in the function and structure described in the exemplary embodiment without departing from the scope of the present disclosure as set forth in the appended claims.

The benefits, advantages, solutions to problems, and any element(s) that may cause any benefit, advantage, or solution to occur or become more pronounced are not to be construed as a critical, required, or essential features or elements of any or all of the claims. The invention is defined solely by the appended claims including any amendments made during the pendency of this application and all equivalents of those claims as issued.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The terms "comprising," "having," and "including" or any other variation thereof, are to be construed as open-ended terms (i.e., meaning "including, but not limited to,") unless otherwise noted. The use of any and all examples, or exemplary language (e.g., "such as") provided herein, is intended merely to illuminate the invention better and does not pose a limitation on the scope of the invention unless otherwise claimed. No language in the specification should be construed as indicating any non-claimed element as essential to the practice of the invention. Further, unless expressly stated to the contrary, "or" refers to an inclusive "or" and not to an exclusive "or". For example, a condition A or B is satisfied by any one of the following: A is true and B is false, A is false and B is true, and both A and B are true. Terms of approximation, such as "about", "generally", "approximately", and "substantially" include values within ten percent greater or less than the stated value.

Unless otherwise defined, all terms (including technical and scientific terms) used in the embodiments of the present invention have the same meaning as commonly understood by an ordinary skilled person in the art to which the present invention belongs.

As used herein, "micro" refers to the descriptive size of certain devices in accordance with certain embodiments of the present disclosure. As used herein, the term "micro-display" refers to the size of a display smaller than 1 inch in its diagonal. However, it is to be appreciated that embodiments of the present disclosure are not necessarily so limited, and that certain aspects of the embodiments may be applicable to a larger size scale.

As used herein, the term "monolithic" refers to the feature of fabrication process forming a LED array. A "monolithic LED array" refers to all LEDs in the LED array formed in the same fabrication process on the substrate.

As used herein, the term "above" describes the relative vertical position of the layers or regions to each other, which encompasses both the above and below orientations depending on the spatial orientation of the micro-display device. Generally, a first layer being above a second layer refers to the layer that is further away from the substrate vertically.

As used herein, the term "primary color" refers to each of the colors that occur in a pixel. Generally, primary colors are defined as the three color components: red (R), green (G), and blue (B). The pixel is repeated across a micro-display to form a device of a desired matrix resolution, the micro-display is said to be substantially comprised of the pixel. The pixel includes LED for emitting the primary colors.

As used herein, the term "dual wavelength" refers to the spectrum of the LED having two emission peaks with two different emission wavelengths. The term "emission peak" refers to a local maximum at the emission wavelength that is at least double the intensity of the emission more than that at nearby or adjacent emission wavelengths.

In the present disclosure, InGaN blue/green dual wavelength LEDs and AlGaInP red LEDs are adopted and integrated. Both LED pixel arrays are monolithically fabricated on their original substrate and then integrated together by flip-chip bonding. Using blue and green CFs on dual wavelength LEDs and monochrome red LEDs, the panel is demonstrated to be an improved full-color LED micro-display with high brightness and better luminance performance.

FIG. 1 shows a schematic cross-sectional view of a blue/green dual wavelength LED epitaxial wafer 100 for fabricating an LED micro-display is shown. The epitaxial wafer 100 comprises, in overlying sequence, a buffer layer 102, an n-(In)GaN layer 103, a multiple quantum well (MQW) active region 104, an electron blocking layer (EBL) 105, and a p-(In)GaN layer 106, all being grown or deposited on the substrate layer 101. In certain embodiments, the above-mentioned semiconductor layers of the epitaxial wafer 100 can be epitaxially grown or deposited on the substrate layer 101 by employing growth methods including, but not limited to, metal-organic chemical vapor deposition (MOCVD), molecular beam epitaxy (MBE), ultra-high vacuum rapid thermal chemical vapor deposition, thermal pulsed laser deposition, pulsed electron deposition, and hydrothermal processes, and the like.

In certain embodiments, the substrate layer 101 comprises gallium nitride (GaN), sapphire, silicon carbide, or silicon. In certain embodiments, the substrate has a thickness between 10 μm and 100 mm.

In certain embodiments, the buffer layer 102 comprises one or more $Al_xGa_{1-x}N$ layers, wherein x is any value (including non-integer) between 0 and 1. When x equals 0, the buffer layer 102 comprises GaN. When x equals 1, the buffer layer 102 comprises AlN. In certain embodiments, the buffer layer 102 has a thickness between 10 nm and 100 μm.

In certain embodiments, the n-(In)GaN layer 103 contains one or more $In_xGa_{1-x}N$ layers, wherein x is any value between 0 and 0.3. The $In_xGa_{1-x}N$ layer may or may not be Si-doped. The Si doping concentration in the n-(In)GaN layer 103 is between 0 and $1\times10^{20}$ $cm^{-3}$.

In certain embodiments, the EBL 105 comprises one or more magnesium-doped (Mg-doped) $Al_xGa_{1-x}N$ and $In_yGa_{1-y}N$ layers, wherein x is any value between 0.01 and 0.3 and y is any value between 0 and 0.3. The magnesium (Mg) doping concentration in the EBL 105 is between $1\times10^{17}$ $cm^{-3}$ and $1\times10^{20}$ $cm^{-3}$.

In certain embodiments, the p-(In)GaN layer 106 is contains one or more Mg-doped $In_xGa_{1-x}N$ layers, wherein the x is any value between 0 and 0.1. The Mg doping concentration in the p-(In)GaN layer 106 is between $1\times10^{17}$ $cm^{-3}$ and $1\times10^{20}$ $cm^{-3}$.

The MQW active region 104 comprises a first quantum well stack 107, a second quantum well stack 108, a third quantum well stack 109, and a quantum barrier layer 1041 provided on top of the quantum well stacks. The first quantum well stack 107 and the third quantum well stack 109 emit a first primary color, and the second quantum well stack 108 emits a second primary color. In the illustrated embodiments, the first quantum well stack 107 includes one or more blue emitting quantum wells (QWs) 1042 and one or more quantum barrier layers 1041. The second quantum well stack 108 includes one or more green emitting QWs 1043 and each QW is separated by a quantum barrier layer 1041. The third quantum well stack 109 includes one or more blue emitting QWs 1042 and each QW is separated by a quantum barrier layer 1041. In certain embodiments, the first primary color is blue, and the second primary color is green. Each blue emitting QW 1042 is sandwiched between two quantum barrier layers 1041. Each green emitting QW 1043 is also sandwiched between two quantum barrier layers 1041. It is apparent to those skilled in the art that the first primary color and the second primary color may be tuned or swapped without departing from the scope and spirit of the invention.

In certain embodiments, the quantum barrier layer 1041 is GaN with a thickness between 5 nm to 30 nm. The quantum barrier layers 1041 may or may not be Si-doped. The Si doping concentration in the quantum barrier layers 1041 is between 0 and $1\times10^{18}$ $cm^{-3}$.

In certain embodiments, the blue emitting QW 1042 comprises a $In_xGa_{1-x}N$ layer, wherein x is any value between 0.1 and 0.2. The blue emitting QW 1042 has a first thickness between 1 and 10 nm.

In certain embodiments, the green emitting QW 1043 comprises a $In_yGa_{1-y}N$ layer, wherein y is any value between 0.2 and 0.3. The green emitting QW 1043 has a second thickness between 1 and 5 nm.

Figure 2A:
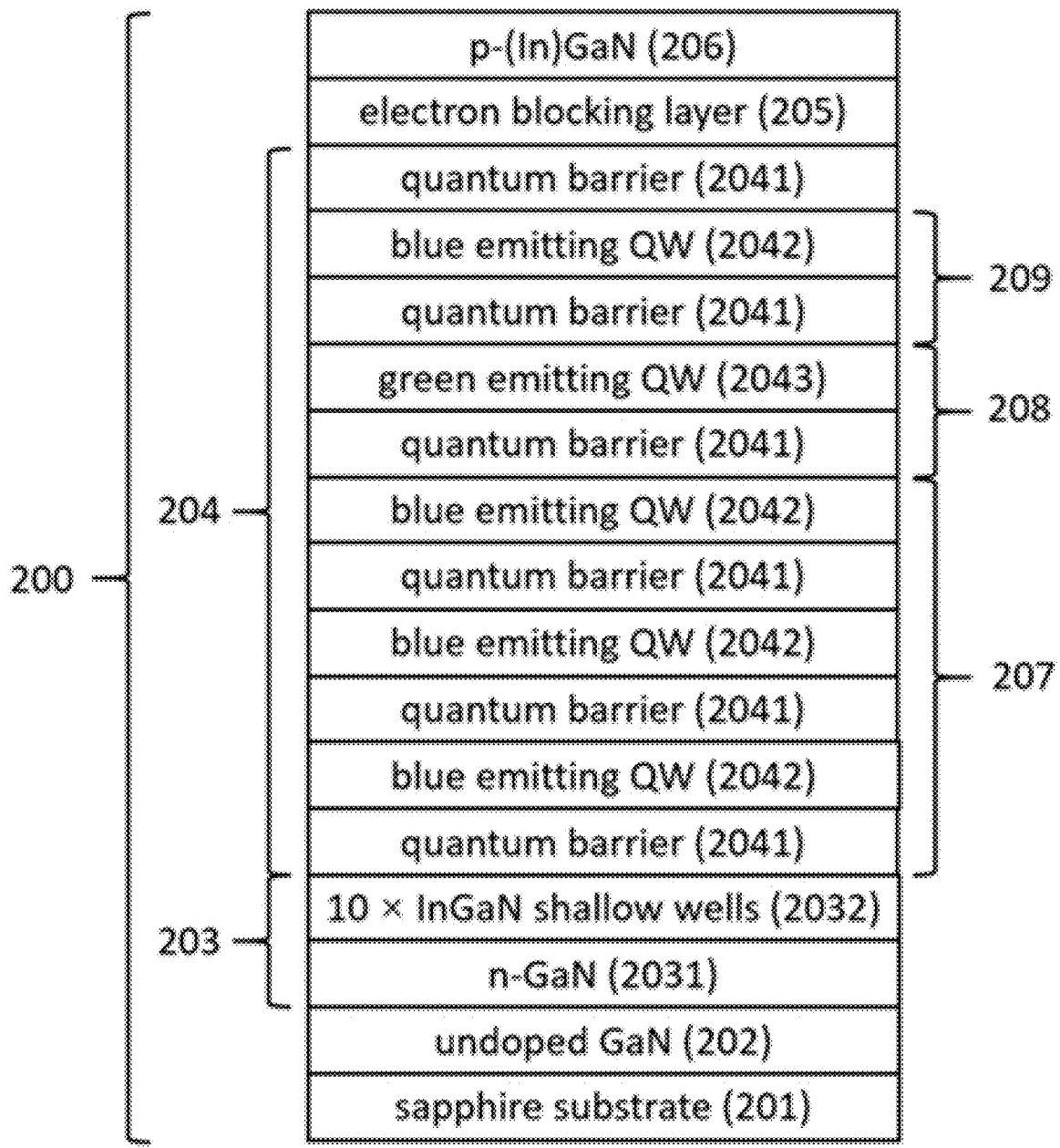
FIG. 2A shows a schematic cross-sectional view of an exemplary blue/green dual wavelength LED epitaxial wafer used for full-color LED micro-displays according to certain embodiments of the present disclosure.

FIG. 2A shows a schematic cross-sectional view of an exemplary blue/green dual wavelength LED epitaxial wafer used for full-color LED micro-displays. In certain embodiments, the epitaxial wafer 200 is grown from a sapphire substrate 201 by MOCVD. The undoped GaN layer 202 is grown as a buffer layer. The n-(In)GaN layer 203 contains a Si-doped n-GaN layer 2031 and InGaN shallow wells 2032. The InGaN shallow wells 2032 contain ten 1 nm/9 nm $In_{0.05}Ga_{0.95}N$/Si-doped n-GaN layers. The InGaN shallow wells 2032 may compensate the strain in the epitaxial wafer 200. A dual wavelength MQWs active region 204 is provided above the n-(In)GaN layer 203. The dual wavelength MQWs active region 204 contains a first quantum well stack 207, a second quantum well stack 208, a third quantum well stack 209, and a quantum barrier 2041 provided on top of the quantum well stacks. Each of the first quantum well stack 207, the second quantum well stack 208 and the third quantum well stack 209 is responsive to charge carriers injected therein for light generation. The first quantum well stack 207 and the third quantum well stack 209 are configured to generate light of a first primary color, and the second quantum well stack 208 is configured to generate light of a second primary color. The first quantum well stack 207 includes three blue emitting QWs 2042 and each blue emitting QWs 2042 is separated by a quantum barrier 2041. The second quantum well stack 208 includes a quantum barrier 2041 and a green emitting QW 2043. The third quantum well stack 209 includes a quantum barrier 2041 and a blue emitting QW 2042. Each blue emitting QW 2042 and each green emitting QW 2043 is sandwiched between two quantum barrier layers 2041. In certain embodiments, a color filter (CF) is coated and patterned onto the epitaxial wafer 200. When the epitaxial wafer 200 is used to generate blue light, a blue CF should be coated. When the epitaxial wafer 200 is used to generate green light, a green CF should be coated.

In one example, the quantum barrier 2041 is a Si-doped n-GaN with a thickness of 16 nm.

In one example, the blue emitting QW 2042 is an $In_{0.15}Ga_{0.85}N$ with a thickness of 2.5 nm thick. The green emitting QW 2043 is an $In_{0.25}Ga_{0.75}N$ with a thickness of 2.5 nm thick.

In one example, the EBL 205 includes five 5 nm/5 nm $Al_{0.1}Ga_{0.9}N/In_{0.05}Ga_{0.95}N$ layers. The EBL 205 is Mg-doped.

In one example, the p-(In)GaN layer 206 includes a Mg-doped p-GaN layer and a Mg-doped p-$In_{0.02}Ga_{0.98}N$ layer stacked above the Mg-doped p-GaN layer for reducing the contact resistance when fabricating the epitaxial wafer 200 as LED micro-display.

Figure 2B:
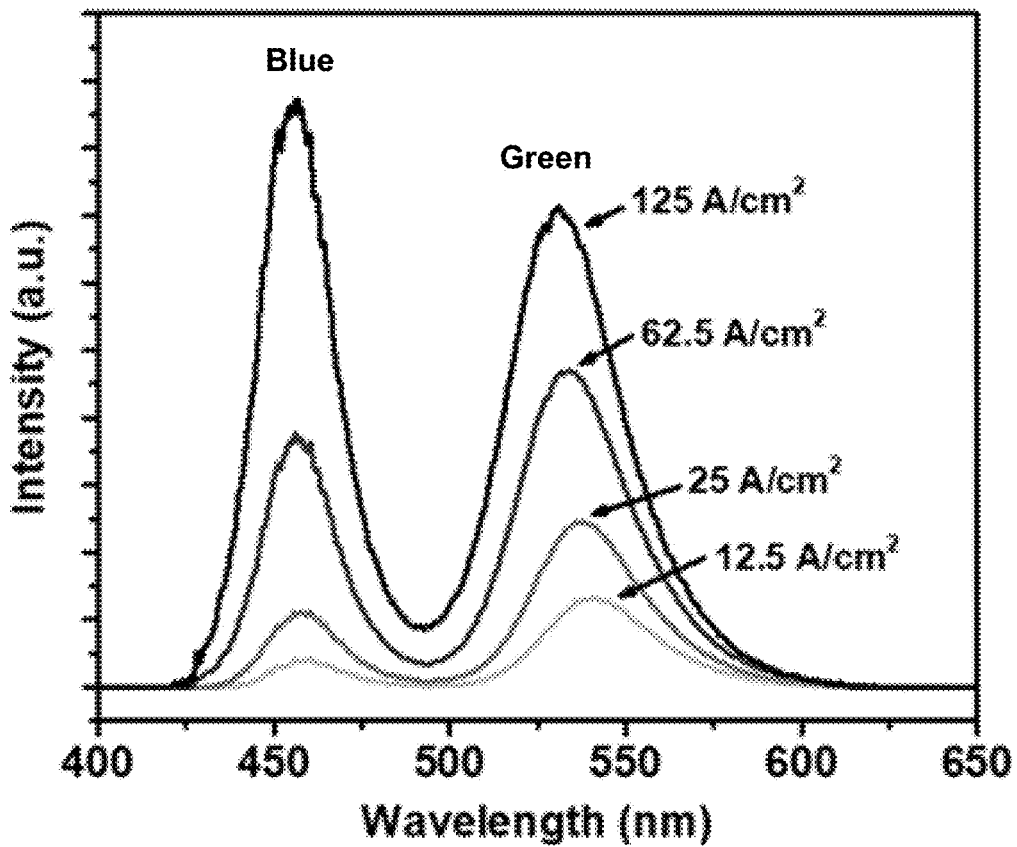
FIG. 2B shows electroluminescence spectra of a LED device fabricated from the blue/green dual wavelength LED epitaxial wafer shown in FIG. 2A.

FIG. 2B shows the electroluminescence spectra of an LED micro-display with an active area of 0.08 mm$^2$ fabricated from the LED epitaxial wafers 200 of FIG. 2A with blue/green dual wavelength. The LED micro-display is driven by driving currents of 10 mA, 20 mA, 50 mA, and 100 mA (corresponding to current densities of 12.5 A/cm$^2$, 25 A/cm$^2$, 62.5 A/cm$^2$, and 125 A/cm$^2$). The light emitted from the LED micro-display, as shown in the electroluminescence spectra, has two emission peaks at approximately 455 nm and 535 nm respectively. The first emission peak in the wavelength range from 420 nm to 500 nm is a blue emission peak, and the second emission peak in the wavelength range from 500 nm to 600 nm is a green emission peak. The blue and the green emission peaks are comparable, which means the power intensity ratio of blue/green emission peaks is in the range of 0.2 and 5. The blue and green emission peaks with comparable power intensity are beneficial to the brightness and the color gamut of the LED micro-display. It is apparent to those skilled in the art that the power intensity ratio of the blue/green emission peaks may not be limited to the range of 0.2 and 5 without departing from the scope and spirit of the invention.

Figure 3A:
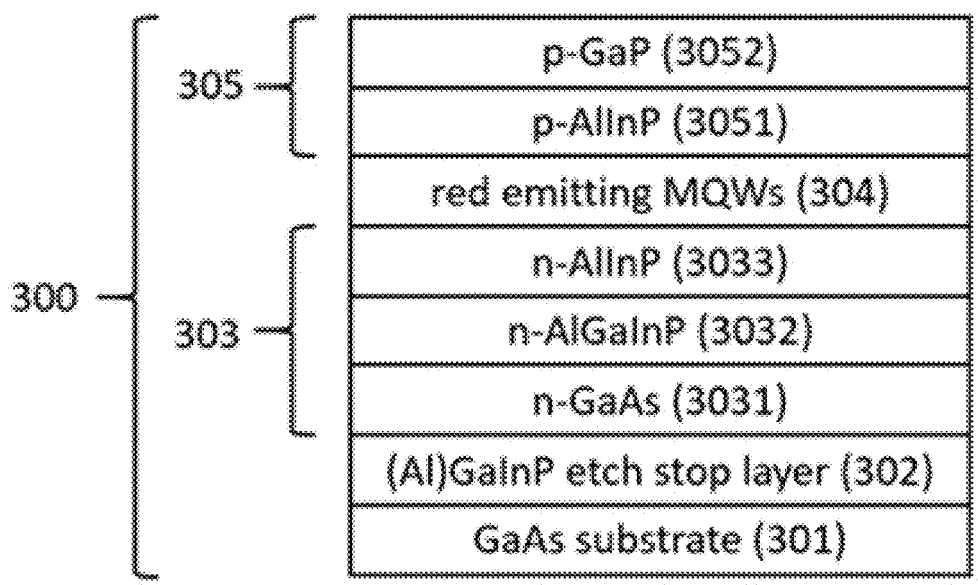
FIG. 3A shows a schematic cross-sectional view of an exemplary red LED epitaxial wafer used for full-color LED micro-displays according to certain embodiments of the present disclosure.

FIG. 3A shows a schematic cross-sectional view of an exemplary monochrome red LED epitaxial wafer used for full-color LED micro-displays. Any kinds of the AlGaInP LED materials may be used for the red emission. In certain embodiments, the epitaxial wafer 300 is grown from a Gallium arsenide (GaAs) substrate 301 by MOCVD. Optionally, an AlGaInP etch stop layer 302 is grown on the GaAs substrate 301. Optionally, the n-side layer 303 comprises a Si-doped n-GaAs layer 3031, a Si-doped n-AlGaInP layer 3032, and a Si-doped n-AlInP layer 3033. A red emitting MQWs active region 304 is provided above the n-side layer 303, which is configured to generate light of red color. The red emitting MQWs active region 304 includes one or more red emitting AlGaInP QWs (not shown), which are sandwiched between two AlGaInP quantum barrier layers (not shown). The QWs and quantum barrier layers have different compositions of Al and Ga. In certain embodiments, the third primary color is red. The p-side layer 305 contains a zinc (Zn) or Mg doped p-AlInP layer 3051 and a Zn or Mg doped p-GaP layer 3052. The red emitting MQWs active region 304 is sandwiched between the n-side layer 303 and the p-side layer 305.

Figure 3B:
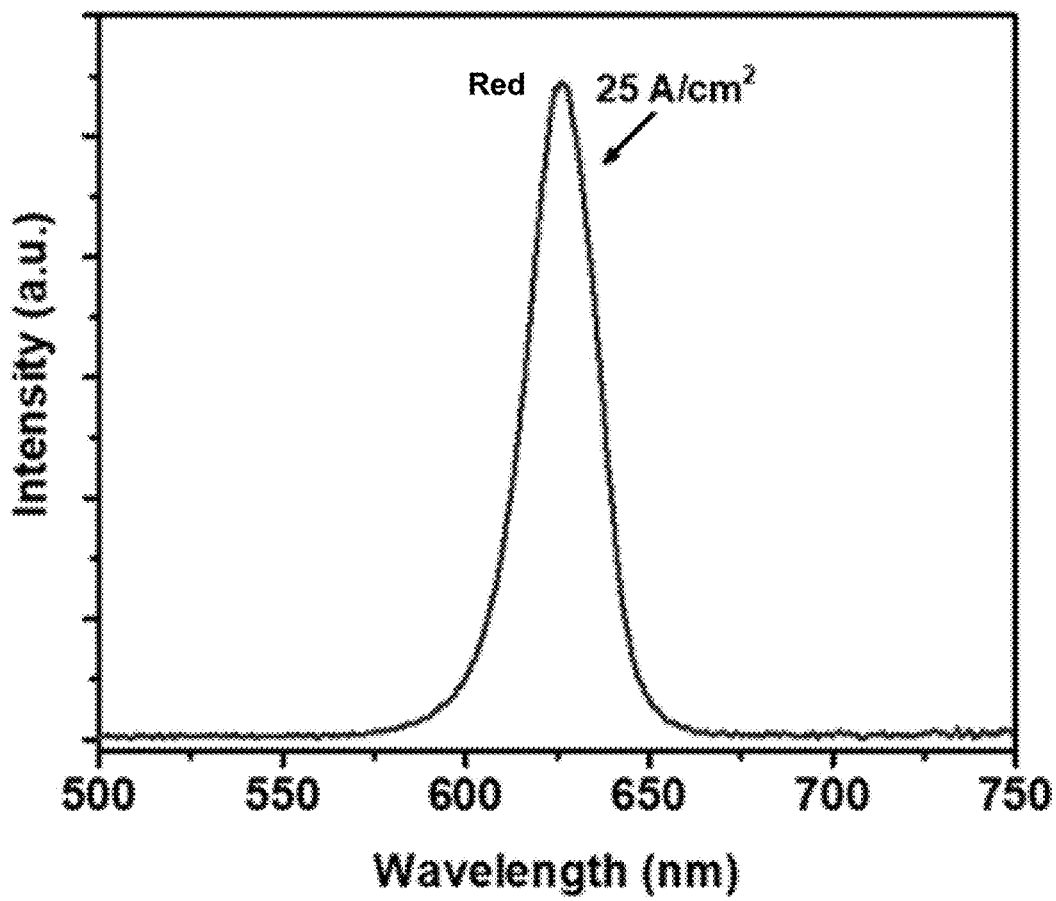
FIG. 3B shows an electroluminescence spectrum of a LED device fabricated from the red LED epitaxial wafer shown in FIG. 3A.

FIG. 3B shows an electroluminescence spectrum of an LED micro-display with an active area of 0.08 mm$^2$ fabricated from an AlGaInP red LED epitaxial wafer 300 of FIG. 3A. The LED micro-display is driven by a driving current of 20 mA (corresponding to current density of 25 A/cm$^2$). The light emitted from the LED micro-display, as shown in the electroluminescence spectrum, has an emission peak at approximately 625 nm. The emission peak is in the wavelength range from 560 nm to 660 nm, which represents a red emission peak.

Based on the above description, an LED micro-display comprises a dual wavelength LED for emitting light having a first primary color and a second primary color, and a monochrome red LED for emitting red light. In one embodiment, the dual wavelength LED is an InGaN blue/green dual wavelength LED having the structure of FIG. 2A; and the monochrome red LED is an AlGaInP red LED having the structure of FIG. 3A. Particularly, the dual wavelength LED and the monochrome red LED have different substrates and different multi-layer semiconductor structures. The dual wavelength LED and the monochrome red LED are integrated and mounted together by flip-chip bonding, such that the sapphire substrate 201 and the GaAs substrate 301 are heterogeneously integrated in the LED micro-display.

Figure 4A:
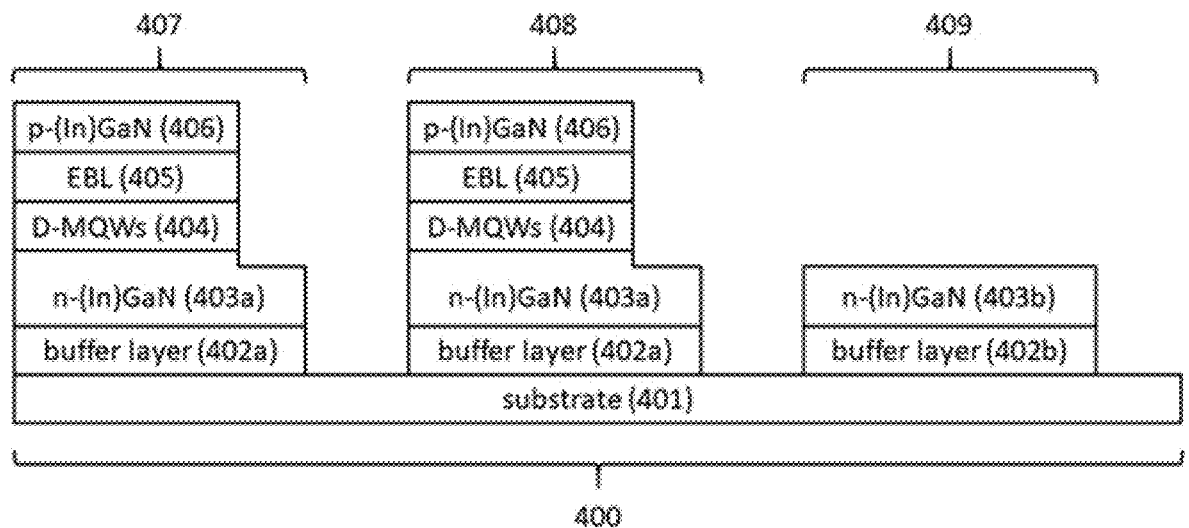
FIG. 4A shows a cross-sectional view of an exemplary LED pixel illustrating the first step to fabricate a monolithic LED array with blue/green dual wavelength LED structure for the first type of full-color LED micro-displays according to certain embodiments of the present disclosure.
Figure 4B:
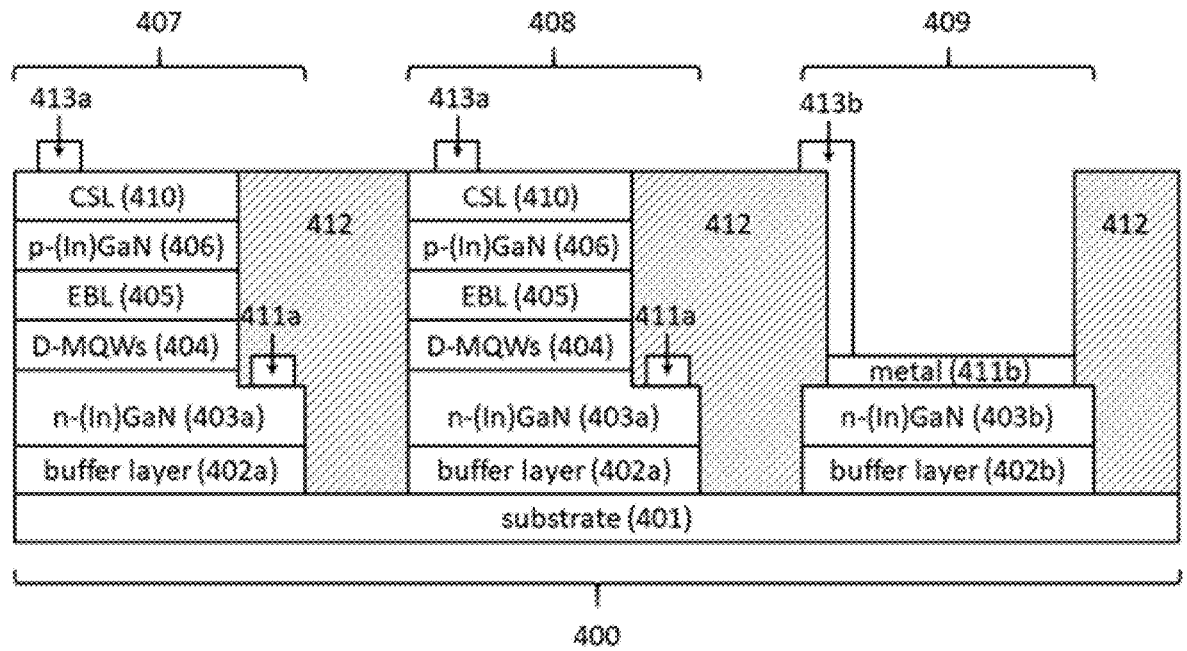
FIG. 4B shows a cross-sectional view of an exemplary LED pixel illustrating the second step to fabricate a monolithic LED array with blue/green dual wavelength LED structure for the first type of full-color LED micro-displays according to certain embodiments of the present disclosure.
Figure 4C:
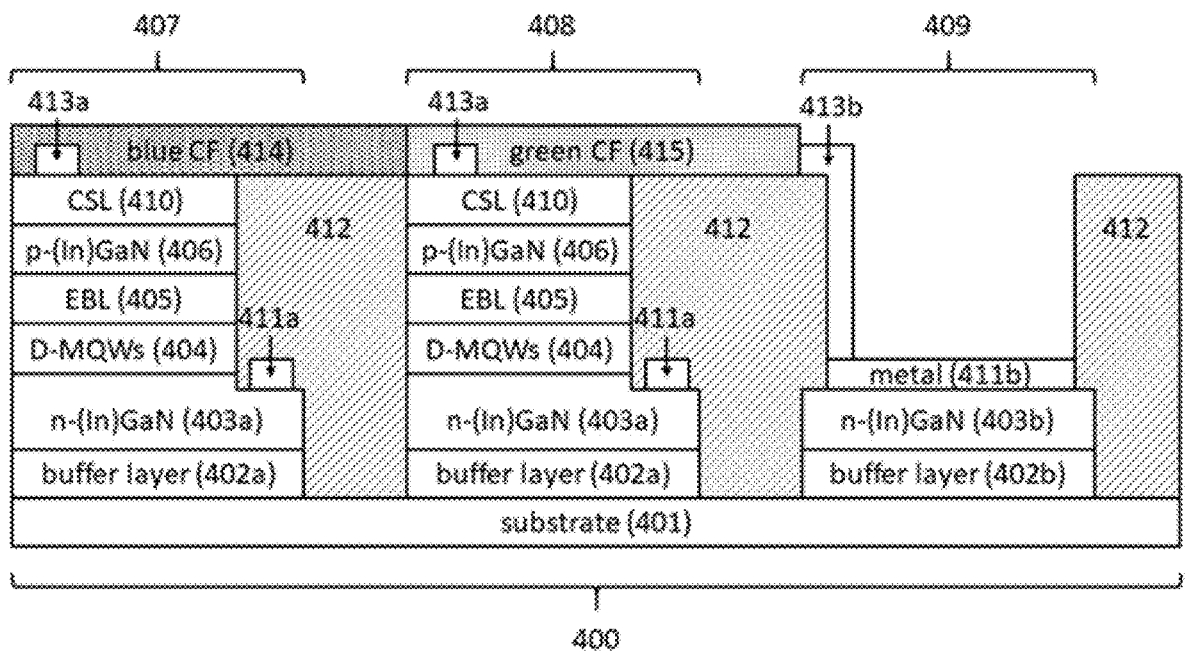
FIG. 4C shows a cross-sectional view of an exemplary LED pixel illustrating the third step to fabricate a monolithic LED array with blue/green dual wavelength LED structure for the first type of full-color LED micro-displays according to certain embodiments of the present disclosure.

FIGS. 4A-4C show the cross-sectional views of an exemplary LED pixel illustrating the fabrication steps of a first monolithic LED array with blue/green dual wavelength LED structure for a full-color LED micro-display in accordance with the first embodiment of the present disclosure.

FIG. 4A shows the first fabrication step of the first monolithic LED array with blue/green dual wavelength LED structure. A blue/green dual wavelength LED epitaxial wafer 400 is used for the fabrication, and in certain embodiments the structure of the epitaxial wafer 400 is the same as the epitaxial wafer 200 of FIG. 2A. On the substrate 401 of the epitaxial wafer 400, two LEDs 407, 408 and a multilayer structure 409 are formed. In certain embodiments, the substrate 401 is a GaN substrate, a sapphire substrate, a silicon carbide substrate, or a silicon substrate. More preferably, the substrate 401 is a sapphire substrate. The first LED 407 and the second LED 408 have the same structure, comprising, in overlying sequence, a buffer layer 402a, a first n-doped semiconductor layer 403a, a dual wavelength MQWs (D-MQWs) active region 404, an EBL 405, and a p-doped semiconductor layer 406. In certain embodiments, the first n-doped semiconductor layer 403a is an n-(In)GaN layer, and the p-doped semiconductor layer 406 is a p-(In)GaN layer. The multilayer structure 409 is designed for the bonding a third LED having a monochrome red LED structure and may comprise a buffer layer 402b and a second n-doped semiconductor layer 403b. In certain embodiments, the second n-doped semiconductor layer 403b is an n-(In)GaN layer. Optionally, the epitaxial layers in the multilayer structure 409 are provided to offset the height difference. The multilayer structure 409 is provided for accommodating and connecting the third LED 506 (FIG. 5A-5C) to the first monolithic LED array when the second monolithic LED array is flip-chip bonded to the first monolithic LED array. In certain embodiments, the whole or part of the multilayer structure 409 may be etched away. To fabricate the first and second LED 407, 408 and the multilayer structure 409, isolation trenches are etched between them by removing portions of all epitaxial layers above the substrate 401. Then the first and second LEDs 407, 408 and the multilayer structure 409 are etched to further expose the first and second n-doped semiconductor layer 403a, 403b. The etching mask may be photoresist, silicon dioxide ($SiO_2$), or silicon nitride ($Si_3N_4$). The etching method may be dry etching (e.g. inductively coupled plasma etching), wet etching, or a combination of dry etching and wet etching. Lithography process may be included to facilitate the etching process. The lithography process may comprise photoresist coating, soft baking, mask aligning, exposure, post-exposure baking, developing photoresist, rinsing, drying, other suitable processes, or any combinations thereof.

FIG. 4B shows the second fabrication step of the first monolithic LED array with blue/green dual wavelength LED structure. Optionally, a current spreading layer (CSL) 410 is deposited and patterned respectively on the first and second LEDs 407, 408. In certain embodiments, the CSL 410 may be an indium tin oxide (ITO) or a Ni/Au metal stack.

On the CSL 410, an n-metal layer 411a, 411b is respectively deposited and patterned for the first and second LEDs 407, 408. The n-metal layer 411a in the first and second LEDs 407, 408 is n-electrodes deposited on the first n-doped semiconductor layer 403a. The n-metal layer 411b in the multilayer structure 409 is a bonding pad. In certain embodiments, the n-metal layer 411a, 411b may be a metal stack comprising one or more layers of metal, such as titanium (Ti), chromium (Cr), aluminum (Al), copper (Cu), nickel (Ni), platinum (Pt), or gold (Au). A passivation layer 412 is coated and patterned after n-metal deposition of the n-metal layer 411a, 411b. The passivation layer 412 has openings on top of the first and second LEDs 407, 408 for the p-electrodes, and in the multilayer structure 409 to expose the n-metal layer 411b. Openings (not shown) are also formed in the passivation layer 412 to expose the n-metal layer (refer to 411c in FIG. 6C) for the bonding of the monochrome red LED. In certain embodiments, the passivation layer 412 may be $SiO_2$, $Si_3N_4$, aluminum oxide ($Al_2O_3$), hard-baked photoresist, organic polymer, or any combination thereof.

A p-metal layer 413a, 413b is deposited and patterned afterwards. The p-metal layer 413a in the first and second LEDs 407, 408 is p-electrodes and the p-metal layer 413b in the multilayer structure 409 forms the p-side connection to the n-metal layer 411b (bonding pad). The p-metal layer 413a, 413b may be a metal stack comprising one or more layers of metal, such as Ti, Cr, Al, Cu, Ni, Pt, or Au.

The CSL 410, the n-metal layer 411a, 411b, and the p-metal layer 413a, 413b may be deposited by evaporation or sputtering. The n-metal layer 411a, 411b, and the p-metal layer 413a, 413b may be patterned by laser lift off process using photoresist, or by etching using masks. The CSL 410, the n-metal layer 411a, 411b, and the p-metal layer 413a, 413b may be annealed after the patterning process at a temperature between 400° C. and 800° C. for 0.5 minute to 10 minutes. The coating method of the passivation layer 412 may be performed by chemical vapor deposition (CVD) for inorganic dielectrics, and may be by spin coating or spray coating for organics. The pattern method of the passivation layer 412 may be performed by etching using masks, or photolithography.

FIG. 4C shows the third fabrication step of the first monolithic LED array with blue/green dual wavelength LED structure. A blue CF 414 is coated on top of the first LED 407 and hard-baked. The blue CF 414 allows blue light to transmit and absorbs the other components of the visible light. Similarly, a green CF 415 is coated on top of the second LED 408 and hard-baked. The green CF 415 allows green light to transmit and absorbs the other components of the visible light. The coating method of the blue CF 414 and the green CF 415 may be performed by spin coating or spray coating. The fabrication process of the first monolithic LED array with blue/green dual wavelength LED structure shown in FIGS. 4A-4C is completed after CF coating. The first LED 407 becomes the blue LED pixel, and the second LED 408 becomes the green LED pixel.

Figure 5A:
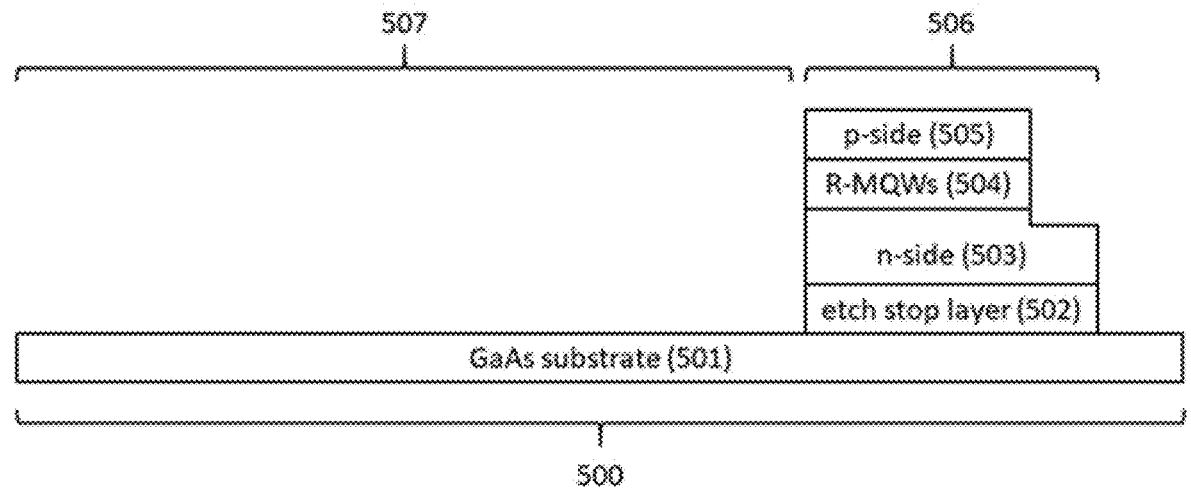
FIG. 5A shows a cross-sectional view of an exemplary LED pixel illustrating the first step to fabricate a monolithic LED array with a monochrome red LED structure for the first type of full-color LED micro-displays according to certain embodiments of the present disclosure.
Figure 5B:
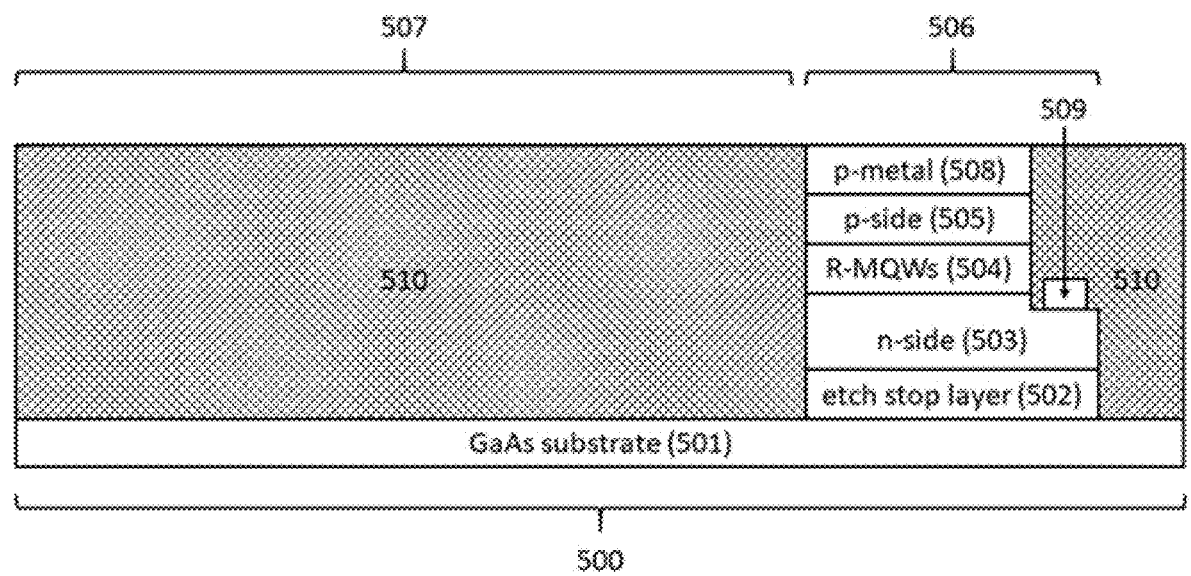
FIG. 5B shows a cross-sectional view of an exemplary LED pixel illustrating the second step to fabricate a monolithic LED array with a monochrome red LED structure for the first type of full-color LED micro-displays according to certain embodiments of the present disclosure.
Figure 5C:
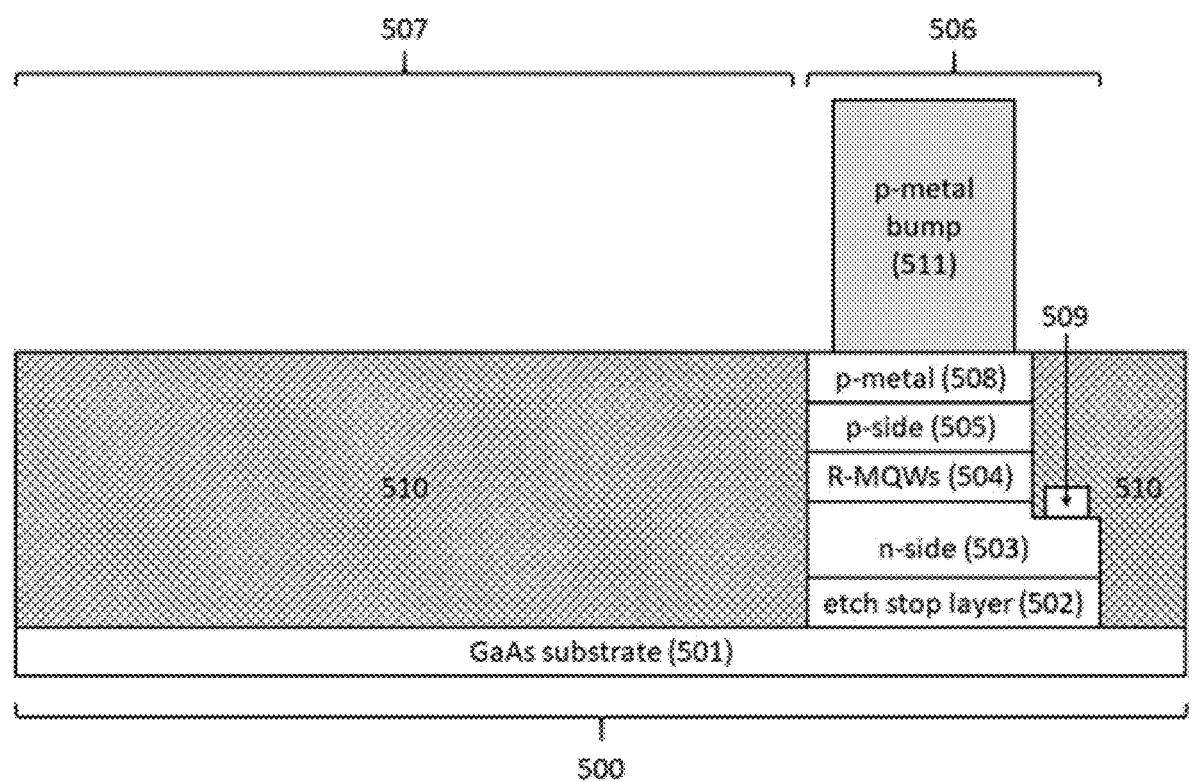
FIG. 5C shows a cross-sectional view of an exemplary LED pixel illustrating the third step to fabricate a monolithic LED array with a monochrome red LED structure for the first type of full-color LED micro-displays according to certain embodiments of the present disclosure.

FIGS. 5A-5C show the cross-sectional views of an exemplary LED pixel illustrating the fabrication steps of a monochrome red LED array for a full-color LED micro-display in accordance with the first embodiment of the present disclosure.

FIG. 5A shows the first fabrication step of a second monolithic LED array with a monochrome red LED structure. A red LED epitaxial wafer 500 is used for the fabrication, and in certain embodiments, the structure of the epitaxial wafer 500 is the same as the epitaxial wafer 300 of FIG. 3A. On the GaAs substrate 501 of the epitaxial wafer 500, a third LED 506 and a window region 507 are formed. The third LED 506 comprises a monochrome red LED structure for emitting red light. Optionally, the third LED 506 comprises an etch stop layer (ESL) 502, an n-side layer 503, a red emitting MQWs (R-MQWs) active region 504, and a p-side layer 505. The window region 507 is provided to be transparent for accommodating the first LED 407 and the second LED 408. Since the epitaxial layers of the third LED 506 absorb light, all epitaxial layers grown on the GaAs substrate 501 in the window region 507 are removed. In certain embodiments, the third LED 506 is first etched to expose the n-side layer 503, then the window region 507 is etched afterwards. The etching mask may be photoresist, $SiO_2$, or $Si_3N_4$. The etching method may be dry etching, wet etching, or a combination of dry etching and wet etching. Lithography process may be included to facilitate the etching process. The lithography process may comprise photoresist coating, soft baking, mask aligning, exposure, post-exposure baking, developing photoresist, rinsing, drying, other suitable processes, or any combinations thereof.

FIG. 5B shows the second fabrication step of the second monolithic LED array with a monochrome red LED structure. The p-metal layer 508 is deposited and patterned on the third LED 506 as a p-electrode. The p-metal layer 508 may be a metal stack comprising one or more layers of metal, such as Zn, beryllium (Be), Ni, Pt, or Au. An n-metal layer 509 is deposited and patterned on the third LED 506 as an n-electrode. The LED array has a common n-electrode structure, so that all n-metal layers are electrically connected. The n-metal layer 509 may be a metal stack comprising one or more layers of metal, such as germanium (Ge), Ni, Pt, Ti, or Au. A passivation layer 510 is coated and patterned after n-metal deposition of the n-metal layer 509. The passivation layer 510 has an opening on top of the third LED 506 for the deposition of the p-metal bump 511 (Refer to FIG. 5C). Openings (not shown) are also formed in the passivation layer 510 to expose the n-metal layer 509 for the n-metal bumps (not shown). The passivation layer 510 may be $SiO_2$, $Si_3N_4$, $Al_2O_3$, hard-baked photoresist, organic polymer, or any combination thereof.

The p-metal layer 508 and n-metal layer 509 may be deposited by evaporation or sputtering. The p-metal layer 508 and n-metal layer 509 may be patterned by laser lift off process using photoresist, or by etching using masks. The p-metal layer 508 and n-metal layer 509 may be annealed after the patterning process at a temperature between 300° C. and 600° C. for 0.5 minute to 10 minutes. The coating method of the passivation layer may be performed by CVD for inorganic dielectrics, and may be by spin coating or spray coating for organics. The pattern method of the passivation layer may be performed by etching using masks, or photolithography.

FIG. 5C shows the third fabrication step of the second monolithic LED array with a monochrome red LED structure. A p-metal bump 511 and n-metal bumps (not shown) are deposited and patterned on the third LED 506 as bonding metal for the subsequent bonding process. The p-metal bump 511 is deposited on top of the p-metal layer 508, and the n-metal bumps are deposited on top of the n-metal layer 509 through the openings (not shown) etched in the passivation layer 510. The p-metal bump 511 and the n-metal bumps may comprise one or more layers of metal, such as Au, gold-tin (Au—Sn) alloy, copper-tin (Cu—Sn) alloy, or gold-indium (Au—In) alloy. The thickness of the p-metal bump 511 and the n-metal bumps may be in a range of 1 μm and 20 μm. The fabrication process of the second monolithic LED array with the monochrome red LED structure shown in FIGS. 5A-5C is completed after bump deposition. In certain embodiments, the area of the patterned p-metal bump 511 and the n-metal bumps may be larger than the openings in the passivation layer 510, and then they are re-shaped by a reflow process at a temperature higher than 170° C. In the reflow process, all metal outside the opening flows into the opening to form metal bumps. By controlling the area ratio of metal patterns and openings, metal bumps of different heights are easily obtained. In certain embodiments, the height of the n-metal bumps 509 may be larger than the p-metal bump 511 to offset any height difference. The p-metal bump 511 and the n-metal bumps 509 may be deposited by evaporation or sputtering. The p-metal bump 511 and the n-metal bumps may be patterned by laser lift off process using photoresist, or by etching using masks.

Figure 6A:
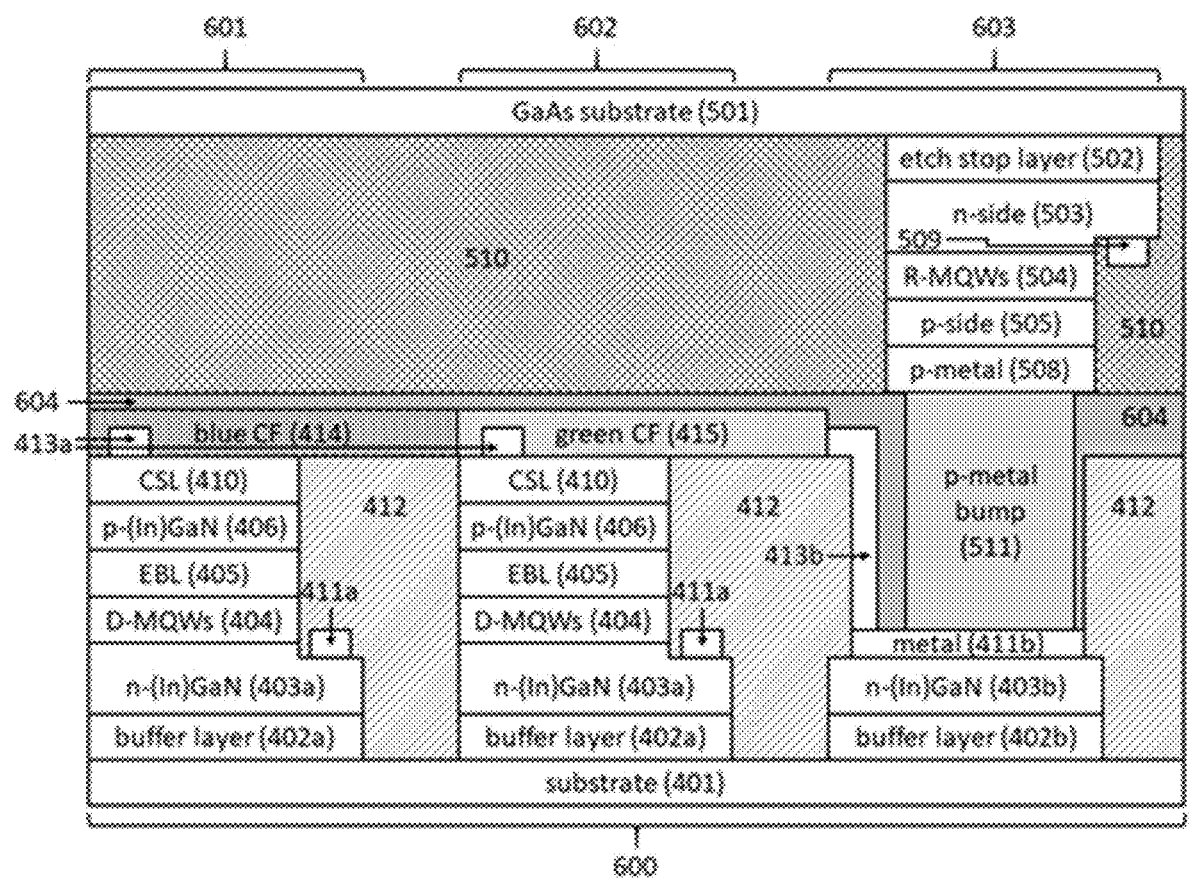
FIG. 6A shows a cross-sectional view of an exemplary LED pixel illustrating the first step to integrate the second monolithic LED array of FIG. 5C and the first monolithic LED array of FIG. 4C for the first type of full-color LED micro-displays according to certain embodiments of the present disclosure.
Figure 6B:
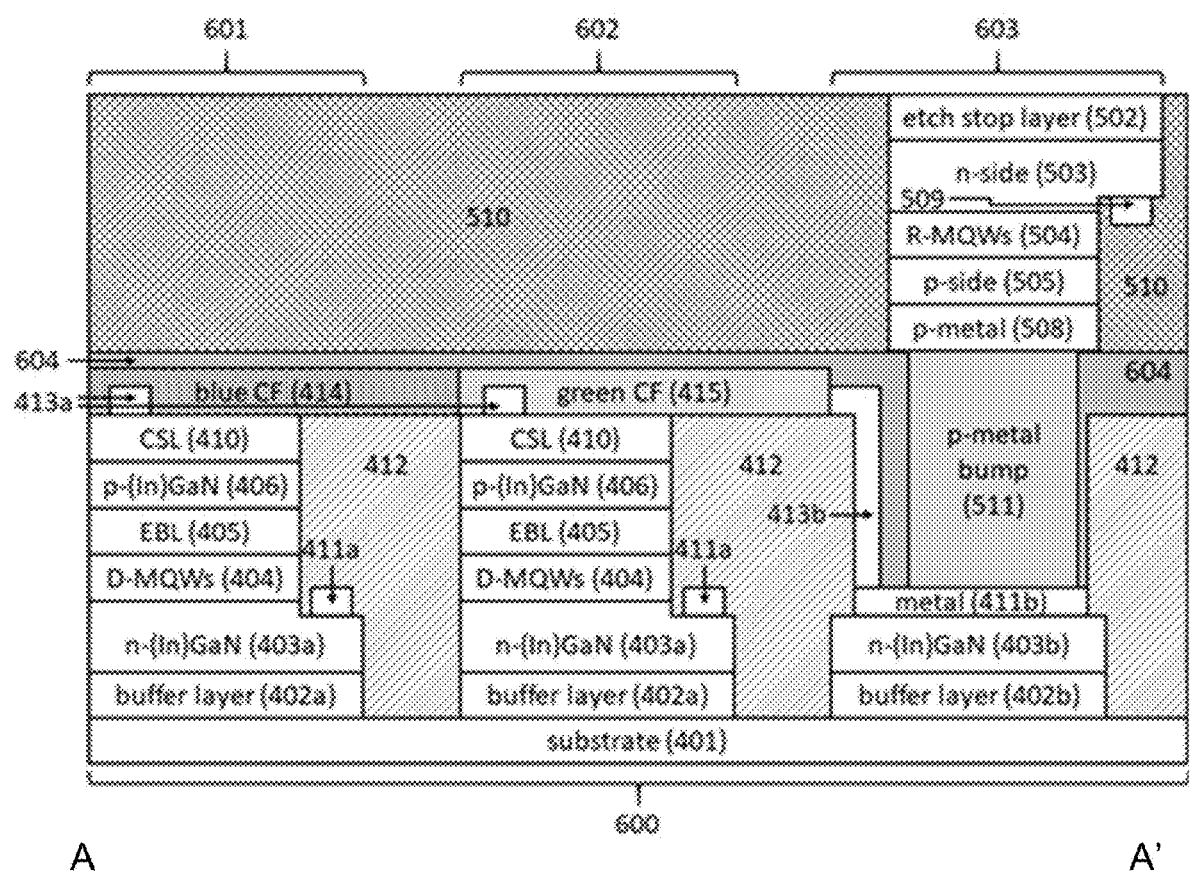
FIG. 6B shows a cross-sectional view of an exemplary LED pixel illustrating the second step to integrate the second monolithic LED array of FIG. 5C and the first monolithic LED array of FIG. 4C for the first type of full-color LED micro-displays according to certain embodiments of the present disclosure.

FIGS. 6A-6B are cross-sectional views of LED pixels showing the fabrication process of heterogeneously integrating the second monolithic LED array having the monochrome red LED structure and the first monolithic LED array having the blue/green dual wavelength LED structure. The cross-sectional structures only show a partial representative of the whole full-color LED micro-display. The second monolithic LED array provides the red LED pixels, and the first monolithic LED array provides the blue and the green LED pixels for the full-color LED micro-display in accordance with the first embodiment of the present disclosure.

FIG. 6A shows the first step to integrate the second monolithic LED array of FIG. 5C and the first monolithic LED array of FIG. 4C. A full-color pixel 600 is formed, by bonding the second monolithic LED array on the first monolithic LED array via the p-metal bump 511 and the n-metal bumps (not shown). A blue LED 601, a green LED 602, and a red LED 603 are provided in the full-color pixel 600. The p-metal bump 511 electrically connects to the p-metal layer 413b at the first monolithic LED array via the n-metal layer 411b and the p-metal layer 508 at the second monolithic LED array. On the other hand, the n-metal bumps electrically connect the n-metal layer 411a at the first monolithic LED array and the n-metal layer 509 at the first monolithic LED array. Optionally, an underfill layer 604 fills the gap between the first and second monolithic LED arrays. The underfill layer 604 may be organic polymers.

The bonding method to bond the second monolithic LED array with the monochrome red LED structure may be flip-chip bonding. In certain embodiments, the bonding temperature is between 150° C. and 300° C., and the bonding time may be between 0.5 minute and 10 minutes. The underfill layer 604 may be coated on the first and second monolithic LED arrays before performing the flip-chip bonding process and is cured during the bonding process or after the bonding process.

FIG. 6B shows the second step to integrate the second monolithic LED array of FIG. 5C and the first monolithic LED array of FIG. 4C. The GaAs substrate 501 is removed, which may be performed by dry etching, wet etching, or a combination of dry etching and wet etching. In certain embodiments, the GaAs substrate 501 is removed by a mixture of ammonia solution and $H_2O_2$ solution. The substrate removal process stops at the surface of the passivation layer 510 and, optionally, the ESL 502, which is provided for improving the etching selectivity. The integration process shown in FIGS. 6A-6B is completed after etching, and the full-color LED micro-display in accordance with the first embodiment of the present disclosure is produced. The feature of the full-color LED micro-display is that the micro-display panel is on the substrate 401 of the first monolithic LED array with blue/green dual wavelength LED structure and one flip-chip bonding process is required. As the blue LED 601 and the green LED 602 each has a dual wavelength MQWs active region 404 of a first material, while the red LED 603 has red emitting MQWs active region 504. The dual wavelength MQWs active region 404 comprise InGaN materials, and the red emitting MQWs active region 504 comprises AlGaInP materials. With the blue CF 414 and the green CF 415, The blue LED 601 emits light of blue color, the green LED 602 emits light of green color, and the red LED 603 emits light of red color. Lights from the blue LED 601 and the green LED 602 can be transmitted through the window region 507, which is transparent.

The full-color LED micro-display obtained from the flip-chip bonding of the first and second monolithic LED arrays is characterized in that the dual wavelength MQWs active region 204 of the blue/green dual wavelength LED structure is positioned at a lower vertical position closer to the substrate 401, and the red emitting MQWs active region 304 of the monochrome red LED structure is positioned at a higher vertical position. Particularly, the monochrome red LED structure of the third LED 409 is vertically above the blue/green dual wavelength LED structure of the first LED 407 and second LED 408. The dual wavelength MQWs active region 204 and the red emitting MQWs active region 304 are formed on two different epitaxial layers that are not overlapping vertically.

As discussed above, the blue/green dual wavelength LED structure includes an n-doped semiconductor layer 403a and a p-doped semiconductor layer 406, and the monochrome red LED structure includes an n-side layer 503 and a p-side layer 505. When the first monolithic LED array is flip-chip bonded to the second monolithic LED array, the full-color LED micro-display will have the epitaxial layers arranged in the following order (from top to bottom) vertically: the p-side layer 505, the red emitting MQWs active region 504, the n-side layer 503, the p-doped semiconductor layer 406, the dual wavelength MQWs active region 404, the n-doped semiconductor layer 403a, and the substrate 401. In another word, the dual wavelength MQWs active region 404 is sandwiched between the n-doped semiconductor layer 403a and the p-doped semiconductor layer 406. Particularly, the p-doped semiconductor layer 406 is positioned above the dual wavelength MQWs active region 404 and the n-doped semiconductor layer 403a. The red emitting MQWs active region 504 is sandwiched between the n-side layer 503 and the p-side layer 505, wherein the n-side layer 503 is positioned above the red emitting MQWs active region 504 and the p-side layer 505.

As the full-color LED micro-display is formed with a matrix of a plurality of pixels arranged in rows and columns, and each pixel has the same arrangement of a stack of semiconductor layers on the substrate 401 having the first LED 407 and the second LED 408 with the blue/green dual wavelength LED structure, and the third LED 409 with the monochrome red LED structure, the full-color LED micro-display of the present disclosure has the advantages of high contrast and better luminance performance, with emission peaks at approximately 455 nm, 535 nm, and 625 nm.

Figure 6C:
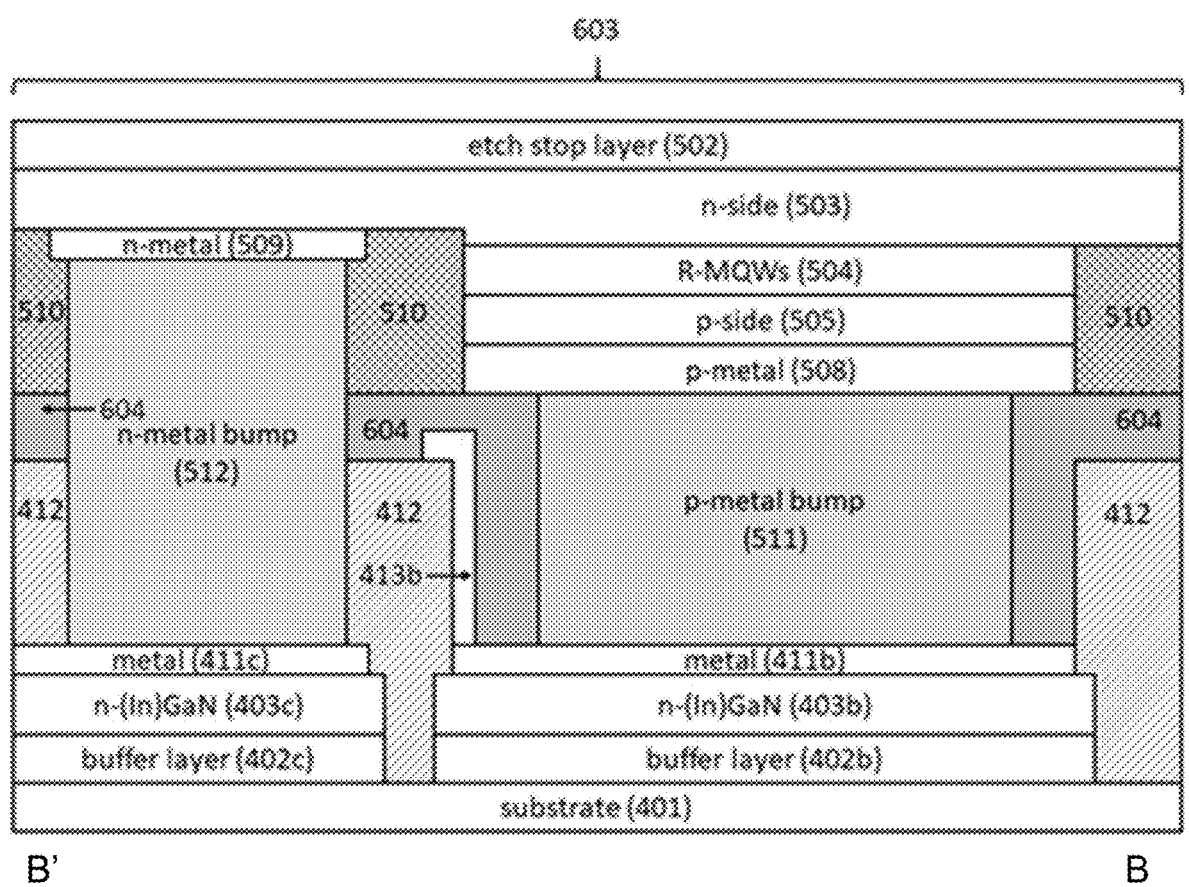
FIG. 6C shows a cross-sectional view of the exemplary LED pixel in FIG. 6B from another direction.

FIG. 6C shows another cross-sectional view of the full-color LED micro-display. Here the electrical connection of an n-metal bump 512 is shown. The bonding structure for the n-metal bump 512 at the first monolithic LED array with blue/green dual wavelength LED structure comprises a buffer layer 402c, a third n-doped semiconductor layer 403c, and an n-metal layer 411c. In certain embodiments, the third n-doped semiconductor layer 403c is an n-(In)GaN layer. This structure of the n-metal bump 512 is similar to the bonding structure for p-metal bumps 511, as discussed above, and the n-metal bumps 512 are formed together in the same fabrication process. The n-metal bump 512 electrically connects the n-metal layer 411c at the first monolithic LED array and the n-metal layer 509 at the second monolithic LED array.

Figure 7:
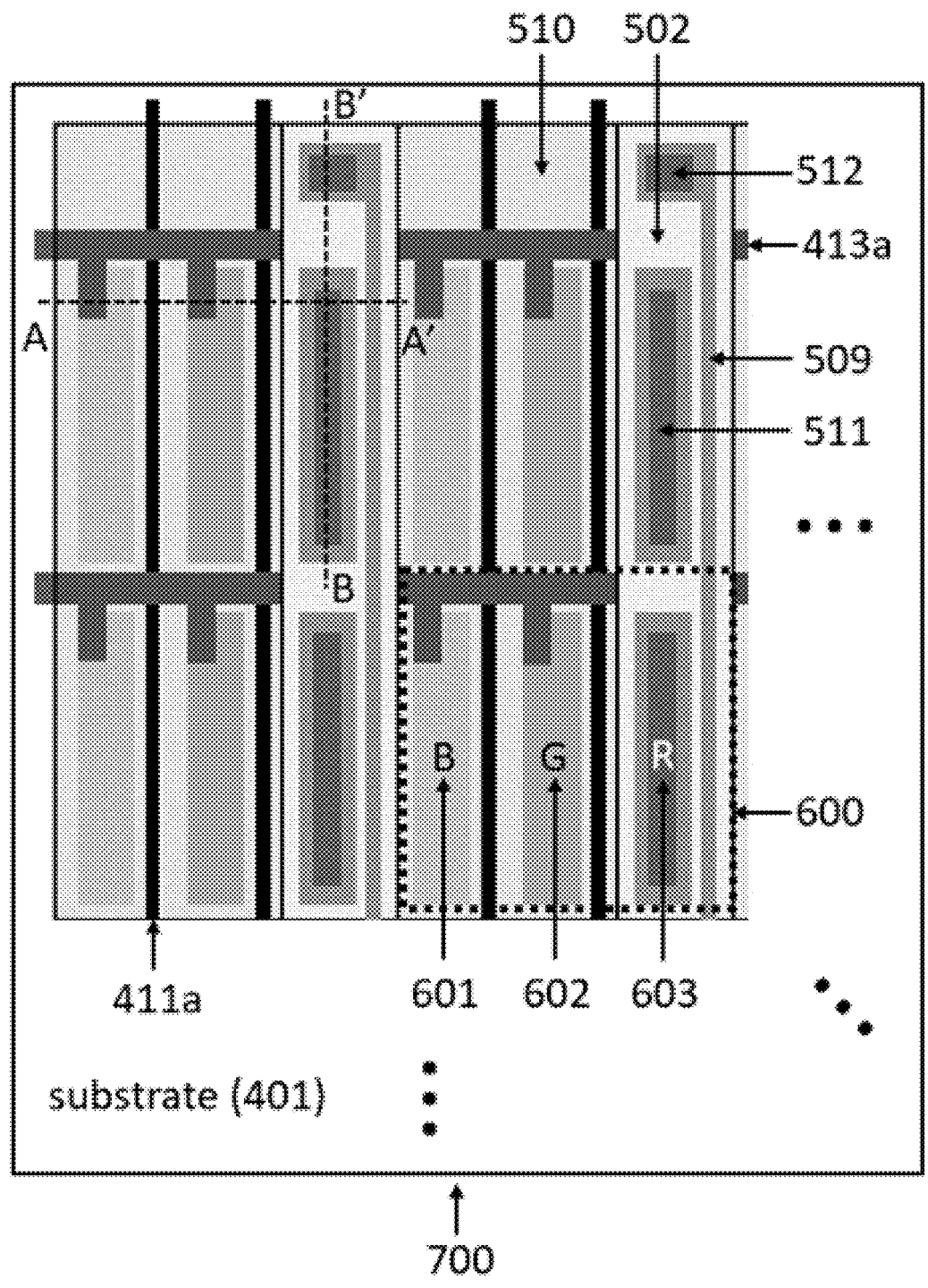
FIG. 7 shows a top view of an exemplary device illustrating a full-color LED micro-display according to the first embodiment of the present disclosure.

FIG. 7 is a top view of an exemplary device illustrating a full-color LED micro-display according to the first embodiment of the present disclosure. The micro-display panel 700 comprises a plurality of pixels 600. Each pixel 600 comprises a blue LED 601, a green LED 602, and a red LED 603. The blue LED 601 and the green LED 602 are formed on a first semiconductor structure with a substrate 401, while the red LED 603 is formed on a second semiconductor structure with a GaAs substrate 501, which is flip-chip bonded on the first semiconductor structure. In certain embodiments, the first semiconductor structure is the first monolithic LED array with blue/green dual wavelength LED structure, and the second semiconductor structure is the second monolithic LED array with a monochrome red LED structure. The upper ends of the blue LED 601 and the green LED 602 are the passivation layer 510 of the second semiconductor structure, and the upper end of the red LED 603 is the ESL 502 or other epitaxial layers of red LED 603. The arrangement of LEDs in the full-color pixel 600 may have other configurations such as Bayer pattern or pentile matrix without departing from the scope and spirit of the present disclosure. The dotted lines indicate the position of the cross-sectional view along the axis A-A' of FIG. 6B, and the cross-sectional view along the axis B-B' of FIG. 6C.

The above disclosed full-color LED micro-display panel 700 has passive-matrix (PM) driving. The n-metal layer 411a sends the data driving signal (source signal) to the blue LED 601 and the green LED 602 in each column. The n-metal layer 411c (FIG. 6C) and the n-metal layer 509 send the data driving signal (source signal) to the red LED 603 via the n-metal bump 512 in each column. The p-metal layer 413a sends the scan driving signal (gate signal) to the LED pixels in each row. The p-metal layer 413b (FIG. 6B) is connected to the p-metal layer 413a in the same row. The red LED 603 is connected with the p-metal layer 413a, 413b via the metal bump 511 and other related bonding pads. The n-metal lines and the p-metal lines form the PM driving circuit. The data driving signal and the scan driving signal may be provided by an application specific integrated circuit (ASIC), a microcontroller unit (MCU), a programmable logic device (PLD), a field-programmable gate array (FPGA), a gate in panel (GIP) circuit, a programmable I/O device, other semiconductor devices, or any combination thereof.

Figure 8A:
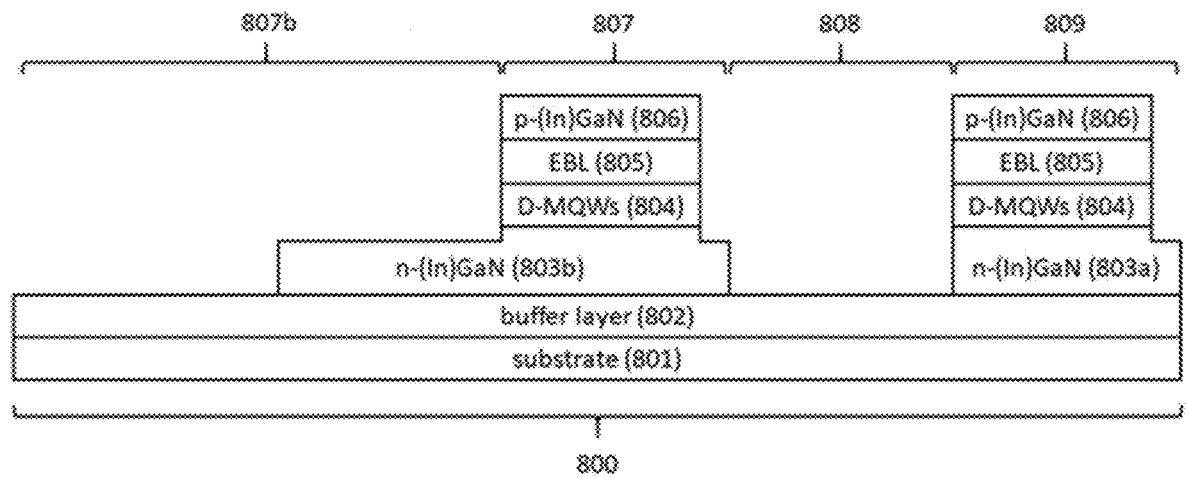
FIG. 8A shows a cross-sectional view of an exemplary LED pixel illustrating the first step to fabricate a monolithic LED array with blue/green dual wavelength LED structure for the second type of full-color LED micro-displays according to certain embodiments of the present disclosure.
Figure 8B:
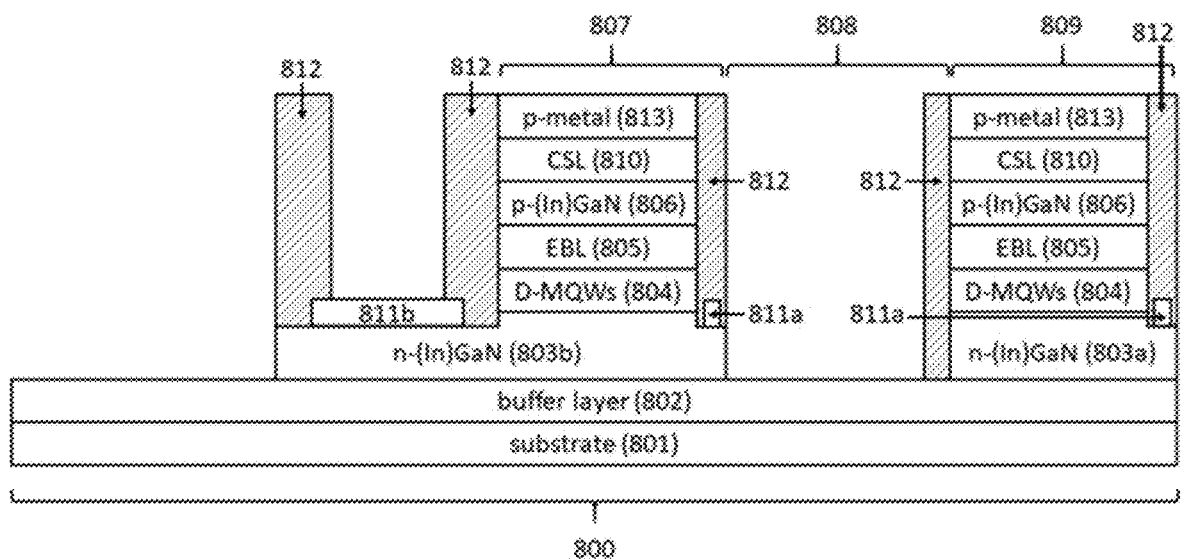
FIG. 8B shows a cross-sectional view of an exemplary LED pixel illustrating the second step to fabricate a monolithic LED array with blue/green dual wavelength LED structure for the second type of full-color LED micro-displays according to certain embodiments of the present disclosure.
Figure 8C:
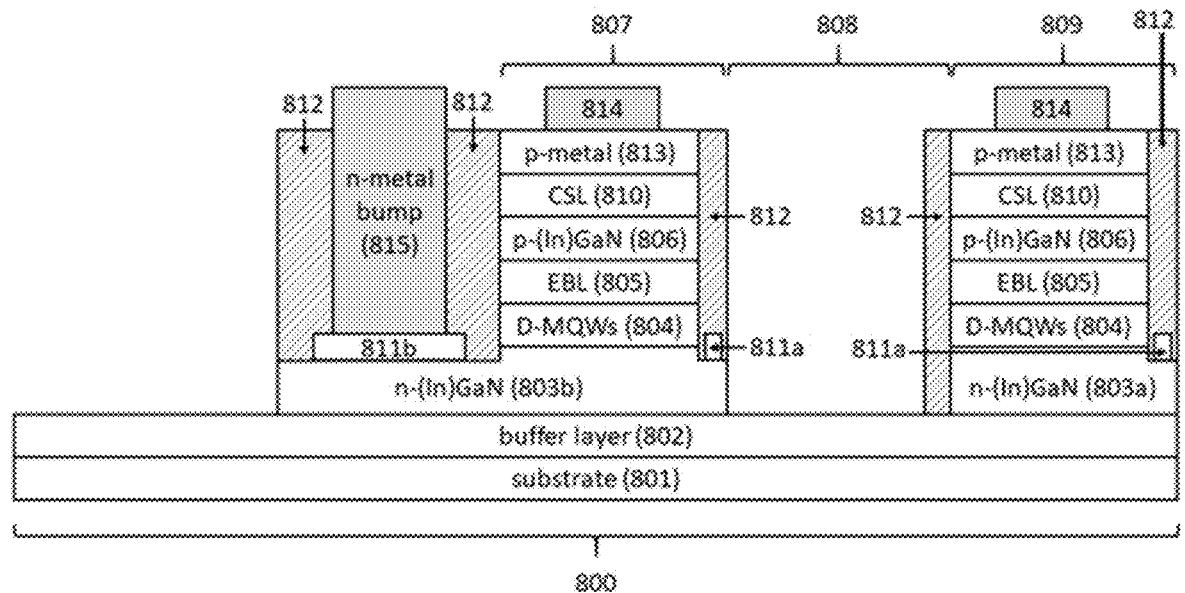
FIG. 8C shows a cross-sectional view of an exemplary LED pixel illustrating the third step to fabricate a monolithic LED array with blue/green dual wavelength LED structure for the second type of full-color LED micro-displays according to certain embodiments of the present disclosure.

FIGS. 8A-8C show the cross-sectional views of an exemplary LED pixel illustrating the fabrication steps of a first monolithic LED array with blue/green dual wavelength LED structure for a full-color LED micro-display in accordance with the second embodiment of the present disclosure.

FIG. 8A shows the first fabrication step of the first monolithic LED array with blue/green dual wavelength LED structure. A blue/green dual wavelength LED epitaxial wafer 800 is used for the fabrication, and in certain embodiments the structure of the epitaxial wafer 800 is the same as the epitaxial wafer 200 of FIG. 2A. On the substrate 801 of the epitaxial wafer 800, two LEDs 807, 809 and a window region 808 are formed. The window region 808 is formed for bonding the red LED 808, and the n-bonding region 807b is formed in the vicinity to the first LED 807 for n-bonding (to be discussed below). The first LED 807 and the second LED 809 each comprises, in overlying sequence, a buffer layer 802, a first n-doped semiconductor material 803a, a second n-dope semiconductor material 803b, a dual wavelength MQWs active region 804, an EBL 805, and a p-doped semiconductor layer 806. In certain embodiments, the first and second n-doped semiconductor layer 803a, 803b are n-(In)GaN layers, and the p-doped semiconductor layer 806 is a p-(In)GaN layer. The mesas of the first LED 807 and the second LED 809 may be identical. The window region 808 comprises a buffer layer 802. The window region 808, the first LED 807, and the second LED 809 are formed by etching. In the window region 808, all epitaxial layers on the substrate 801 other than the buffer layer 802 are removed. In the n-bonding region 807b, all epitaxial layers on the substrate 801 other than the buffer layer 802 and part of the second n-doped semiconductor layer 803b are removed. The buffer layer 802 may be intact or partially etched. The remaining buffer layer 802 can protect the LED array in the substrate removal process. The first and second LEDs 807, 809 are etched to expose the first and second n-doped semiconductor layers 803a, 803b. The etching mask may be photoresist, SiO2, Si3N4. The etching method may be dry etching, wet etching and a combination of dry etching and wet etching.

FIG. 8B shows the second fabrication step of the first monolithic LED array with blue/green dual wavelength LED structure. Optionally, an CSL 810 is deposited and patterned on the two LEDs 807, 809. The CSL 810 may be ITO or a Ni/Au metal stack.

On the CSL 810, an n-metal layer 811a, 811b is respectively deposited and patterned for the first and second LEDs 807, 809. The n-metal layer 811a in the first and second LEDs 807, 809 is n-electrodes on the first n-doped semiconductor layer 803a. The n-metal layer 811b is a bonding pad in the n-bonding region 807b. The LED array has a common n-electrode structure, so that the n-metal layers 811a and 811b are electrically connected. A p-metal layer 813 is also deposited and patterned on the CSL 810. In certain embodiments, the n-metal layer 811a, 811b and the p-metal layer 813 may be a metal stack comprising one or more layers of metal, such as Ti, Cr, Al, Cu, Ni, Pt, Au. A passivation layer 812 is coated and patterned after metal deposition. The passivation layer 812 has openings on the p-metal layer 813 of the first and second LEDs 807, 809, on an exposed region of the buffer layer 802 and on the n-metal layer 811b. These openings are left for metal bump formation and pixel bonding. In certain embodiments, the passivation layer may be $SiO_2$, $Si_3N_4$, $Al_2O_3$, hard-baked photoresist, organic polymer, or any combination thereof.

The CSL 810, the n-metal layer 811a, and the p-metal layer 813 may be deposited by evaporation or sputtering. The n-metal layer 811a and the p-metal layer 813 may be patterned by laser lift off process using photoresist, or by etching using masks. The CSL 410 and metals may be annealed after the patterning process at a temperature between 400° C. and 800° C. for 0.5 minute to 10 minutes. The coating method of the passivation layer may be performed by CVD for inorganic dielectrics, and may be by spin coating or spray coating for organics. The pattern method of the passivation layer 812 may be performed by etching using masks, or photolithography.

FIG. 8C shows the third fabrication step of the first monolithic LED array with blue/green dual wavelength LED structure. P-metal bumps 814 on the first and second LEDs 807, 809 and an n-metal bump 815 are deposited and patterned as bonding metal for the subsequent bonding process. The p-metal bumps 814 are on the top of the p-metal layer 813, and the n-metal bump 815 is on the top of the n-metal layer 811b through openings in the passivation layer 812. The p-metal bumps 814 and the n-metal bump 815 may comprise one or more layers of metal, such as Au, Au—Sn alloy, Cu—Sn alloy, Au—In alloy. The thickness of the p-metal bumps 814 and the n-metal bump 815 may be between 1 μm to 10 μm. The fabrication process of the first monolithic LED array with blue/green dual wavelength LED structure shown in FIG. 8A-8C is completed after bump deposition. In certain embodiments, the height of the p-metal bumps 814 and the n-metal bump 815 may be controlled by adjusting the area ratio of the metal patterns and openings, and by a reflow process, which are both explained in the previous description. In certain embodiments, the height of the n-metal bump 815 may be larger than the p-metal bumps 814 to offset the height difference.

Figure 9A:
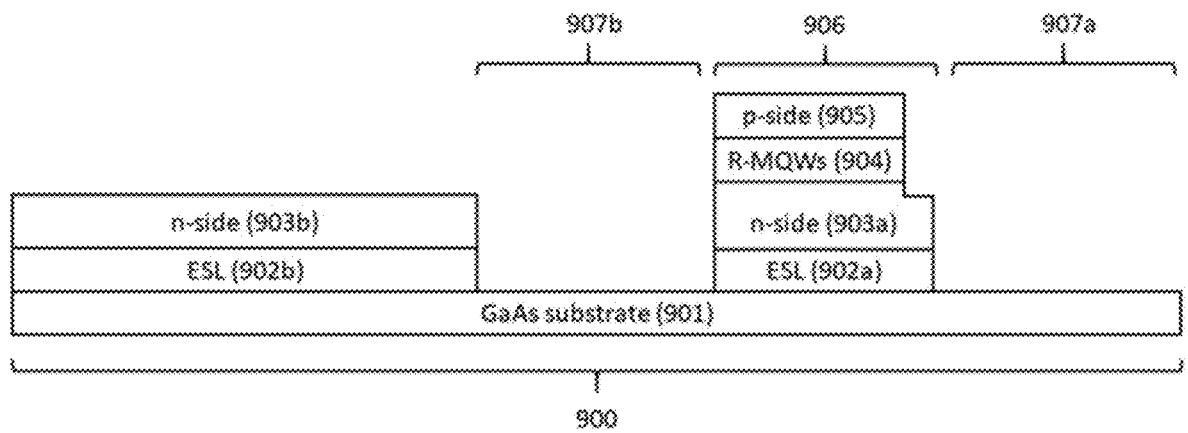
FIG. 9A shows a cross-sectional view of an exemplary LED pixel illustrating the first step to fabricate a monolithic LED array with a monochrome red LED structure for the second type of full-color LED micro-displays according to certain embodiments of the present disclosure.
Figure 9B:
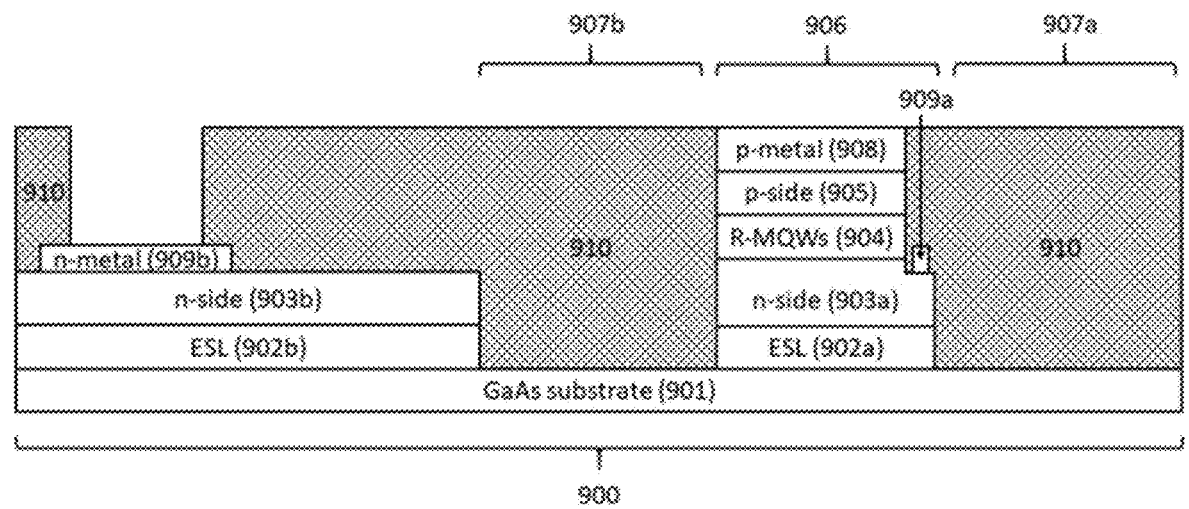
FIG. 9B shows a cross-sectional view of an exemplary LED pixel illustrating the second step to fabricate a monolithic LED array with a monochrome red LED structure for the second type of full-color LED micro-displays according to certain embodiments of the present disclosure.
Figure 9C:
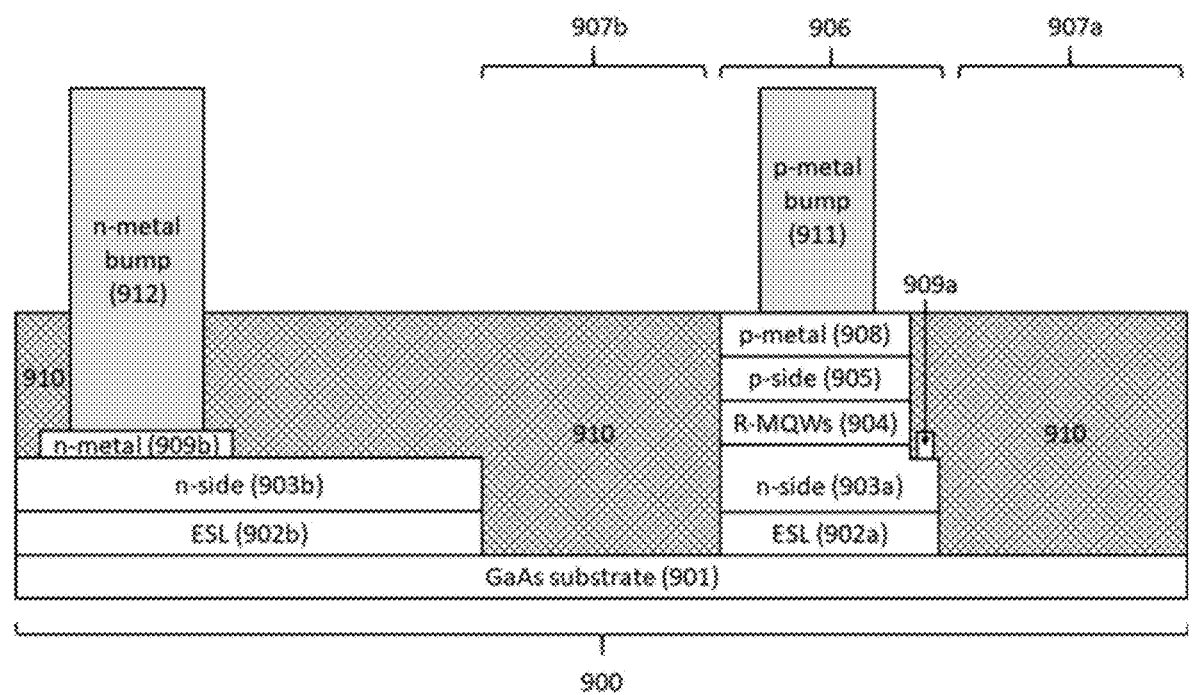
FIG. 9C shows a cross-sectional view of an exemplary LED pixel illustrating the third step to fabricate a monolithic LED array with a monochrome red LED structure for the second type of full-color LED micro-displays according to certain embodiments of the present disclosure.

FIG. 9A-9C show cross-sectional views of an exemplary LED pixels illustrating the fabrication steps of a second monolithic LED array with a monochrome red LED structure for a full-color LED micro-display in accordance with the second embodiment of the present disclosure.

FIG. 9A shows the first fabrication step of the second monolithic LED array with the monochrome red LED structure. A red LED epitaxial wafer 900 is used for the fabrication, and in certain embodiments, the structure of the epitaxial wafer 900 is the same as the epitaxial wafer 300 shown in FIG. 3A. On the GaAs substrate 901 of the epitaxial wafer 900, a monolithic red LED 906 and window regions 907a, 907b are formed. The monolithic red LED 906 comprises an n-side layer 903a, a red emitting MQWs active region 904, a p-side layer 905, and optionally an ESL 902a. The window regions 907a, 907b is provided to be transparent for accommodating the first LED 807 and the second LED 809. All epitaxial layers grown on the GaAs substrate 901 in the window region 907a, 907b are removed. A structure for n-electrode connection comprising an ESL 902b and n-side layer 903b is also formed. The ESL 902a, 902b and the n-side layer 903a, 903b may be formed in the same etching process. In certain embodiments, the red LED epitaxial wafer 900 is firstly etched to expose the n-side layer 903a, 903b, and the window regions 907a, 907b are etched afterwards. The etching mask may be photoresist, $SiO_2$, or $Si_3N_4$. The etching method may be dry etching, wet etching, or a combination of dry etching and wet etching.

FIG. 9B shows the second fabrication step of the second monolithic LED array with the monochrome red LED structure. A p-metal layer 908 is deposited and patterned on the monolithic red LED 906 as a p-electrode. The p-metal layer 908 may be a metal stack comprising one or more layers of metals such as Zn, Be, Ni, Pt, or Au. N-metal layers 909a, 909b are deposited and patterned on the n-side layer 903a, 903b as n-electrodes. The n-metal layer 909b is also a bonding pad for n-metal bumps. The LED array has a common n-electrode structure, so that the n-metal layers 909a, 909b are electrically connected. The n-metal layer 909a, 909b may be a metal stack comprising one or more layers of metal, such as Ge, Ni, Pt, Ti, or Au. A passivation layer 910 is coated and patterned afterwards after n-metal deposition of the n-metal layers 909a, 909b. The passivation layer 910 has openings on the top of the monolithic red LED 906 for the deposition of the p-metal bump 911 (Refer to FIG. 9C), and on the top of the n-metal layer 909b for the n-metal bump 912 (Refer to FIG. 9C). The passivation layer 910 may be $SiO_2$, $Si_3N_4$, $Al_2O_3$, hard-baked photoresist, organic polymer, or any combination thereof.

The n-metal layers 909a, 909b and the p-metal layer 908 may be deposited by evaporation or sputtering. The n-metal layers 909a, 909b and the p-metal layer 908 may be patterned by laser lift off process using photoresist, or by etching using masks. The n-metal layers 909a, 909b and the p-metal layer 908 may be annealed after the patterning process at a temperature between 300° C. and 600° C. for 0.5 minute to 10 minutes. The coating method of the passivation layer 910 may be performed by CVD for inorganic dielectrics, and may be by spin coating or spray coating for organics. The pattern method of the passivation layer 910 may be performed by etching using masks, or photolithography.

FIG. 9C shows the third fabrication step of the second monolithic LED array with the monochrome red LED structure. A p-metal bump 911 and an n-metal bump 912 are deposited and patterned on the top of the monolithic red LED 906 and the n-metal layer 909b respectively, as bonding metals for the subsequent bonding process. The p-metal bump 911 and the n-metal bump 912 connect with their corresponding metal electrodes through openings etched in the passivation layer 910. The p-metal bump 911 and the n-metal bump 912 may comprise one or more layers of metal, such as Au, Au—Sn alloy, Cu—Sn alloy, or Au—In alloy. The thickness of the p-metal bump 911 and the n-metal bumps 912 may be between 1 μm to 20 μm. The fabrication process of the second monolithic LED array with the monochrome red LED structure in shown in FIGS. 9A-9C is completed after bump deposition. In certain embodiments, the height of the p-metal bump 911 and the n-metal bumps 912 may be controlled by adjusting the area ratio of metal patterns and openings, and a reflow process, which are both explained in the previous description. In certain embodiments, the height of the n-metal bumps 912 may be more than the p-metal bump 911 to offset the height difference. The deposition method of metals in the above steps may be evaporation or sputter. The p-metal bump 911 and the n-metal bumps 912 may patterned by laser lift off process using photoresist, or by etching using masks.

FIGS. 10A-10D are cross-sectional views of the LED pixels showing the fabrication process of integrating a first monolithic LED array with blue/green dual wavelength LED structure and a second monolithic LED array with a monochrome red LED structure on a driver panel to obtain a full-color pixel 1000. The cross-sectional structures only show a partial representative of the whole LED array. The second monolithic LED array provides the red LED pixels, and the first monolithic LED array provides the blue and the green LED pixels for the full-color LED micro-display in accordance with the second embodiment of the present disclosure.

Figure 10A:
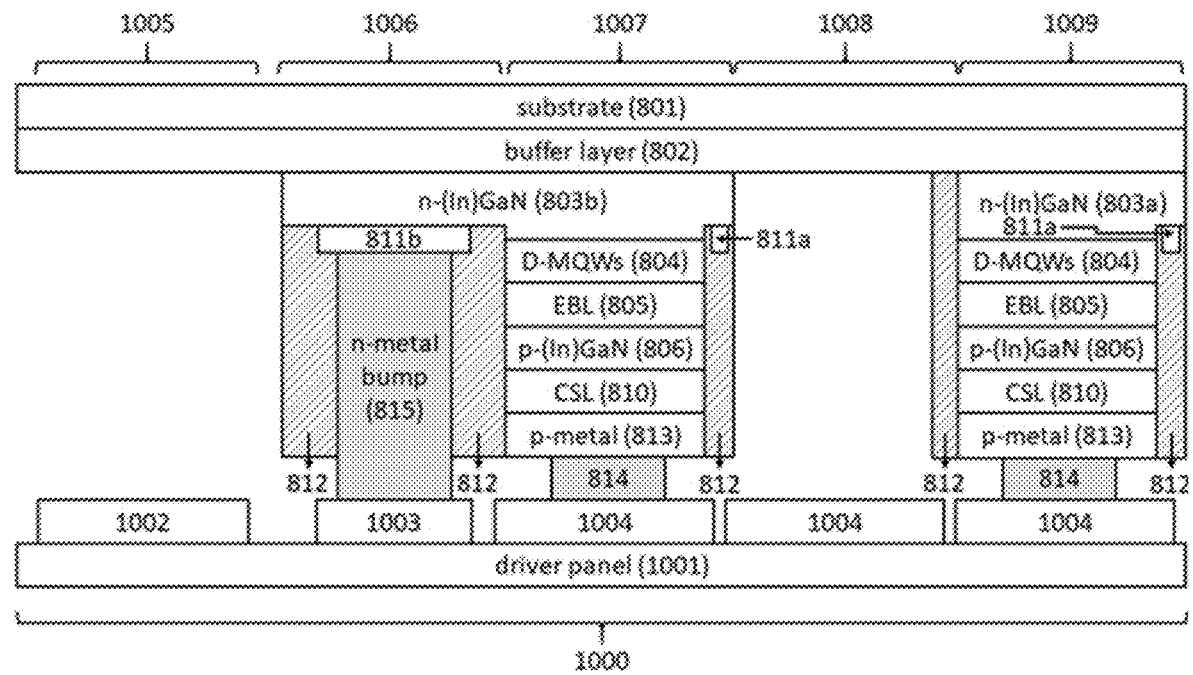
FIG. 10A shows a cross-sectional view of an exemplary LED pixel illustrating the first step to integrate the first monolithic LED array with blue/green dual wavelength LED structure shown in FIG. 8C and a driver panel for the second type of full-color LED micro-displays according to certain embodiments of the present disclosure.
Figure 10B:
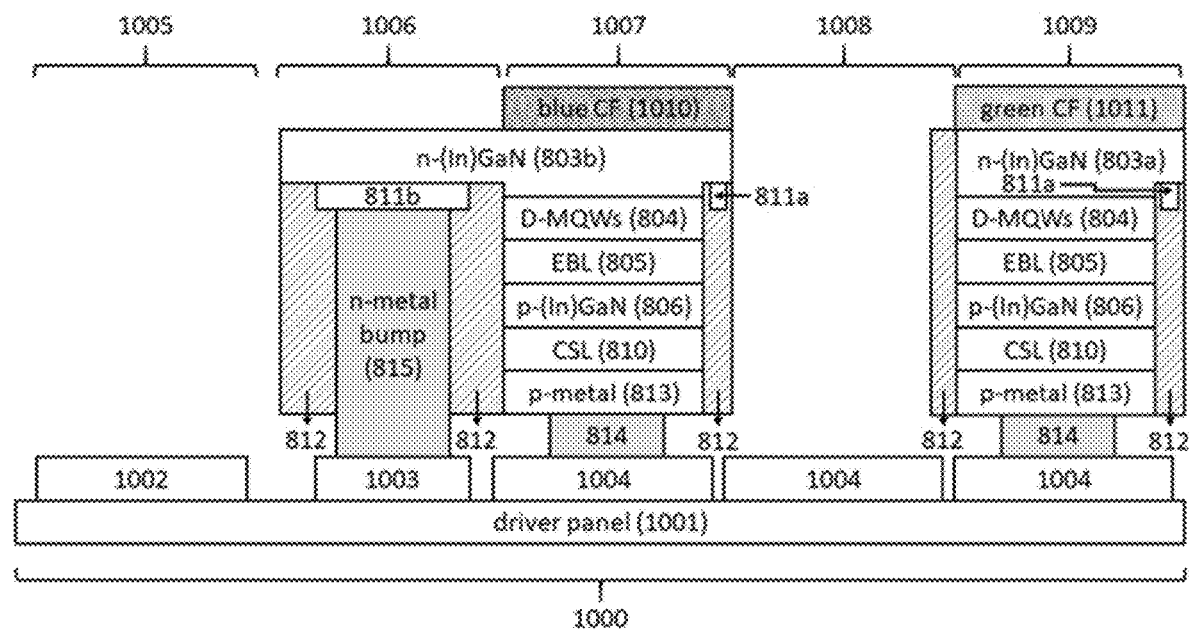
FIG. 10B shows a cross-sectional view of an exemplary LED pixel illustrating the second step to integrate the first monolithic LED array with blue/green dual wavelength LED structure shown in FIG. 8C and a driver panel for the second type of full-color LED micro-displays according to certain embodiments of the present disclosure.
Figure 10C:
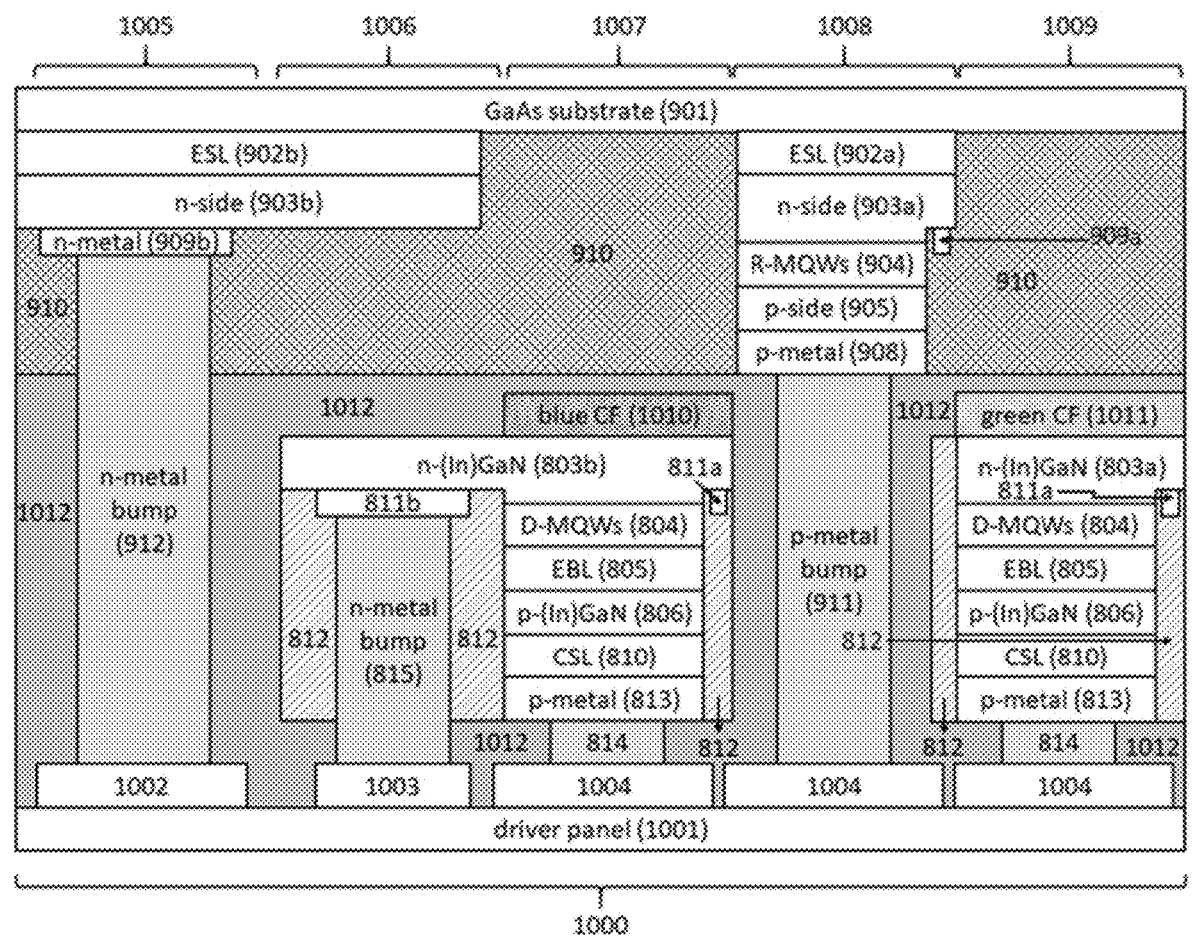
FIG. 10C shows a cross-sectional view of an exemplary LED pixel illustrating the first step to integrate the second monolithic LED array with the monochrome red LED structure shown in FIG. 9C and the integration of the first monolithic LED array and the driver panel shown in FIG. 10B for the second type of full-color LED micro-displays according to certain embodiments of the present disclosure.

FIG. 10A shows the first step to integrate the first monolithic LED array shown in FIG. 8C and a driver panel 1001. A full-color pixel 1000 is partially formed after bonding the first monolithic LED array on a driver panel 1001. The driver panel 1001 may be a CMOS driving chip, a thin-film transistor (TFT) driving backplane, a gate-in-panel (GIP) circuit, or other driver panels that comprise circuits on a panel substrate. On the driver panel 1001, there is a first bonding pad 1002 for the n-connection of the red LED array, a second bonding pad 1003 for the n-connection of the first monolithic LED array, and three pixel bonding pads 1004 for the p-connection of the three LEDs 1007, 1008, 1009. The p-metal bumps 814 electrically connect the p-metal layer 813 to the pixel bonding pads 1004. The n-metal bump 815 electrically connects the n-metal layer 811b and the second bonding pad 1003. A first n-bonding region 1005 is provided for the red LED array, and a second n-bonding region 1006 is provided for the first monolithic LED array. The full-color pixel 1000 includes a first LED 1007 comprising a blue/green dual wavelength LED structure for emitting blue light, a second LED 1009 comprising the blue/green dual wavelength LED structure for emitting green light, and a third LED 1008 comprising a monochrome red LED structure for emitting red light. The three LEDs 1007, 1008, 1009 shown in FIGS. 10A-10C are incomplete. The first monolithic LED array with blue/green dual wavelength LED structure may be flip-chip bonded to the driver panel 1001 at a bonding temperature between 150° C. and 300° C. The bonding time may be between 0.5 minute and 10 minutes.

FIG. 10B shows the second step to integrate the first monolithic LED array with blue/green dual wavelength LED structure and a driver panel 1001. The substrate 801 in FIG. 10A is removed in the second step. The method of substrate removal may be dry etching, wet etching and a combination of dry etching and wet etching. In certain embodiments, the substrate 801 is silicon and removed by HNA (HF-nitric acid-acetic acid) etchant. The substrate removal process stops at the surface of the remaining buffer layer 802. Then the buffer layer 802 is removed by dry etching. A blue CF 1010 is coated on the top of the first LED 1007 and a green CF 1011 is also coated on the top of the second LED 1009. The coating method of the CF layers may be spin coating or spray coating. The blue CF 1010 and the green CF 1011 are hard-baked.

FIG. 10C shows the first step to integrate the second monolithic LED array with the monochrome red LED structure shown in FIG. 9C and the integration of the first monolithic LED array and the driver panel. A red LED array is bonded to the full-color pixel 1000 on the driver panel 1001 through the window region 808 and the n-bonding region 807b of the first monolithic LED array with blue/green dual wavelength LED structure. The p-metal bump 911 electrically connects the p-metal layer 908 and the pixel bonding pad 1004. The n-metal bump 912 electrically connects the n-metal layer 909b and the first bonding pad 1002. Optionally, an underfill layer 1012 fills the gap between dual wavelength and red LED arrays. The underfill layer 1012 may be organic polymers. The red LED array may be flip-chip bonded thereto at a bonding temperature between 150° C. and 300° C. The bonding time may be between 0.5 minute and 10 minutes. The underfill material may be coated before the bonding process and is cured during the bonding process or after the bonding process.

Figure 10D:
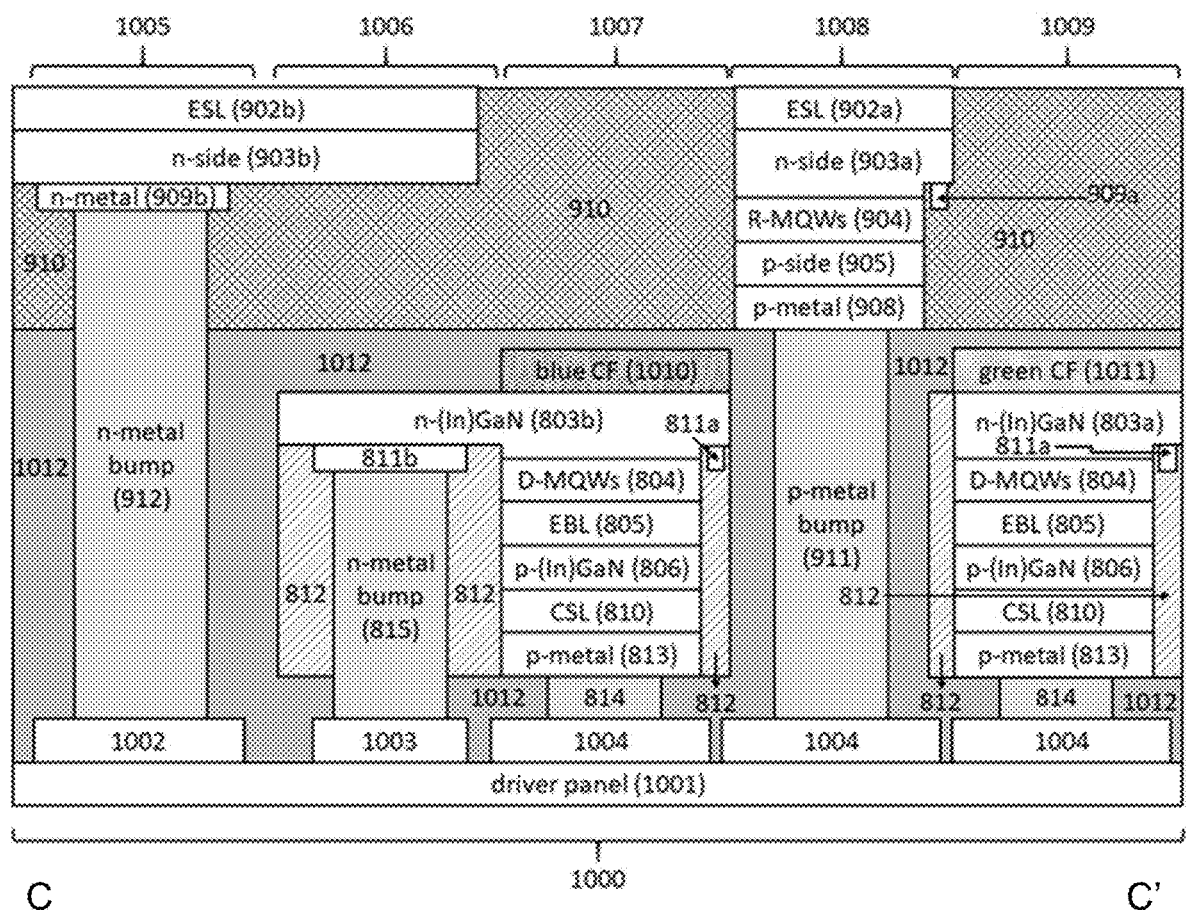
FIG. 10D shows a cross-sectional view of an exemplary LED pixel illustrating the second step to integrate the second monolithic LED array with the monochrome red LED structure shown in FIG. 9C and the integration of the first monolithic LED array and the driver panel shown in FIG. 10B for the second type of full-color LED micro-displays according to certain embodiments of the present disclosure.

FIG. 10D shows the second step to integrate the second monolithic LED array with the monochrome red LED structure shown in FIG. 9C and the integration of the first monolithic LED array and the driver panel. The GaAs substrate 901 in FIG. 10C is removed in the second step. The method of substrate removal may be dry etching, wet etching and a combination of dry etching and wet etching. In certain embodiments, the GaAs substrate 901 is removed by a mixture of ammonia solution and $H_2O_2$ solution. The substrate removal process stops at the surface of the passivation layer 910 and optionally the etch stop layer 902a, 902b. The etch stop layer 902a, 902b can improve the etching selectivity. The integration process as described in FIGS. 10A-10D is completed after etching, and the full-color LED micro-display in accordance with the second embodiment is produced. The feature of the LED micro-display of the second embodiment is that an external micro-display driver panel is adopted and bonding twice. The first LED 1007 emits light of blue color, the second LED 1009 emits light of green color, and the third LED 1008 emits light of red color. Lights from the first LED 1007 and the second LED 1009 can be transmitted through the transparent window regions 907a, 907b on the second monolithic LED array.

Figure 11:
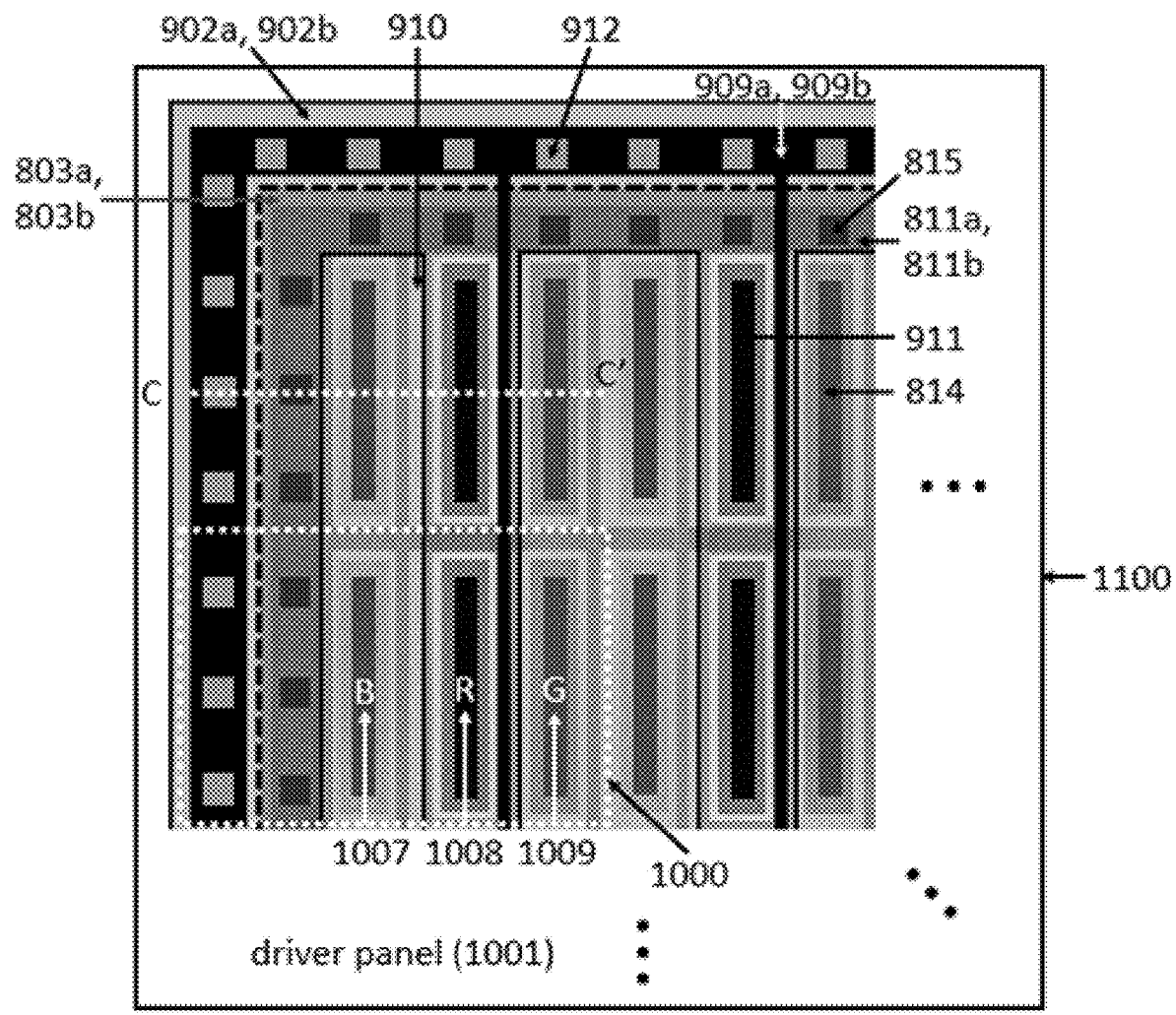
FIG. 11 shows a top view of an exemplary device illustrating a full-color LED micro-display according to the second embodiment of the present disclosure.

FIG. 11 a top view of an exemplary device illustrating a full-color LED micro-display according to the second embodiment of the present disclosure. The micro-display panel 1100 comprises a plurality of full-color pixels 1000 and a driver panel 1001. The plurality of full-color pixels 1000 are provided on a lower semiconductor structure and an upper semiconductor structure. The first LED 1007 and the second LED 1009 are formed on the lower semiconductor layers, wherein the lower semiconductor layers are the first monolithic LED array with blue/green dual wavelength LED structure and is firstly bonded to the driver panel 1001. The third LED 1008 is formed on the upper semiconductor layers, wherein the upper semiconductor layers are the second monolithic LED array with the monochrome red LED structure and is bonded afterwards. Lights from the first LED 1007 and the second LED 1009 are transmitted through the passivation layer 910 of the upper semiconductor layers, and the surface of the third LED 1008 is the etch stop layer 902a, 902b or other epitaxial layers of the upper semiconductor layers. This arrangement of the three LEDs 1007, 1008, 1009 in the full-color pixels 1000 may have other configurations, such as Bayer pattern or pentile matrix, without departing from the scope and spirit of the present disclosure. The dotted line indicates the position of the cross-sectional view along the axis C-C' of FIG. 10D. The dashed lines indicate the periphery of the first and second n-doped semiconductor layers 803a, 803b.

The above disclosed full-color LED micro-display panel may be PM driving or active-matrix (AM) driving depending on the type of the driver panel 1001. The n-metal layer 811a, 811b at the first monolithic LED array and the n-metal layer 909a, 909b at the second monolithic LED array are all connected to one common signal via the n-metal bumps 815, 912. The p-metal bumps 814, 911 connects the p-electrodes of the three LEDs 1007, 1008, 1009 to the driver panel 1001 and driving signals are sent from here. The three LEDs 1007, 1008, 1009 have the same common n-electrode signal and individual p-electrode driving signals. The signals may be provided by an ASIC, a MCU, a PLD, an FPGA, a GIP circuit, a programmable I/O device, other semiconductor devices, or a combination of any aforesaid devices.

This illustrates the fundamental structure of the full-color LED micro-display with heterogeneous integration of InGaN blue/green dual wavelength LEDs and AlGaInP red LEDs in accordance with the present disclosure. It will be apparent that variants of the above-disclosed and other features and functions, or alternatives thereof, may be integrated into other semiconductor devices. The present embodiment is, therefore, to be considered in all respects as illustrative and not restrictive. The scope of the disclosure is indicated by the appended claims rather than by the preceding description, and all changes that come within the meaning and range of equivalency of the claims are therefore intended to be embraced therein.

What is claimed is:

1. A full-color light-emitting diode (LED) micro-display comprising a plurality of pixels, each pixel comprising:
   a first LED comprising a blue/green dual wavelength LED structure for emitting blue light;
   a second LED comprising the blue/green dual wavelength LED structure for emitting green light; and
   a third LED comprising a monochrome red LED structure for emitting red light, wherein:
   the blue/green dual wavelength LED structure further comprises a dual wavelength multiple quantum wells (MQWs) active region of a first material with two emission peaks, wherein the dual wavelength MQWs active region comprises a first quantum well stack, a second quantum well stack, and a third quantum well stack;
   the first quantum well stack and the third quantum well stack are configured for generating the blue light, and the second quantum well stack is configured for generating the green light; and
   the monochrome red LED structure further comprises a red emitting MQWs active region of a second material with a second emission peak.

2. The full-color LED micro-display of claim 1, wherein the first material is Indium gallium nitride (InGaN) and the second material is Aluminum gallium indium phosphide (AlGaInP).

3. The full-color LED micro-display of claim 2, wherein the first quantum well stack and the third quantum well stack each comprises one or more blue emitting quantum wells (QWs) and one or more quantum barrier layers; and the second quantum well stack comprises one or more green emitting QWs and one or more quantum barrier layers.

4. The full-color LED micro-display of claim 3, wherein the first quantum well stack comprises three blue emitting QWs; the second quantum well stack comprises one green emitting QW; and the third quantum well stack comprises one blue emitting QW.

5. The full-color LED micro-display of claim 4, wherein:
   each blue emitting QW is an $In_xGa_{1-x}N$ layer with a first thickness between 1 and 10 nm, wherein x is any value between 0.1 and 0.2; and
   the green emitting QW is an $In_xGa_{1-x}N$ layer with a second thickness between 1 and 5 nm, wherein y is any value between 0.2 and 0.3.

6. The full-color LED micro-display of claim 2, wherein the blue/green dual wavelength LED structure further comprising:
   a buffer layer comprising an undoped gallium nitride (GaN) layer;
   an n-doped semiconductor layer comprising a Si-doped n-GaN layer and an InGaN shallow wells; and
   a p-doped semiconductor layer comprising a Mg-doped p-GaN layer and a Mg-doped $p-In_{0.02}Ga_{0.98}N$ layer stacked above the Mg-doped p-GaN layer.

7. The full-color LED micro-display of claim 2, wherein the monochrome red LED structure further comprising:
   an n-side layer comprising a Si-doped n-GaAs layer, a Si-doped n-AlGaInP layer, and a Si-doped n-AlInP layer; and
   a p-side layer comprising a Zn or Mg doped p-AlInP layer and a Zn or Mg doped p-GaP layer,
   wherein:
   the red emitting MQWs active region is sandwiched between the n-side layer and the p-side layer; and
   the red emitting MQWs active region comprises one or more red emitting AlGaInP quantum wells (QWs) sandwiched between two AlGaInP quantum barrier layers.

8. The full-color LED micro-display of claim 2, wherein:
   the blue/green dual wavelength LED structure further comprises an electron blocking layer (EBL);
   the EBL further comprises one or more magnesium-doped (Mg-doped) $Al_xGa_{1-x}N$ with a magnesium doping concentration between $1\times10^{17}$ cm$^{-3}$ and $1\times10^{20}$ cm$^{-3}$, and $In_yGa_{1-y}N$ layers; and
   x is any value between 0.01 and 0.3 and y is any value between 0 and 0.3.

9. The full-color LED micro-display of claim 1, wherein the dual wavelength MQWs active region and the red emitting MQWs active region are formed on two different epitaxial layers that are not overlapping vertically.

10. The full-color LED micro-display of claim 8, wherein the dual wavelength MQWs active region is positioned at a lower vertical position closer to a substrate layer than the red emitting MQWs active region.

11. The full-color LED micro-display of claim 1, wherein:
   the blue/green dual wavelength LED structure further comprises an n-doped semiconductor layer and a p-doped semiconductor layer;
   the monochrome red LED structure further comprises an n-side layer and a p-side layer;
   the dual wavelength MQWs active region is sandwiched between the n-doped semiconductor layer and the p-doped semiconductor layer, wherein the p-doped semiconductor layer is positioned above the dual wavelength MQWs active region and the n-doped semiconductor layer; and
   the red emitting MQWs active region is sandwiched between the n-side layer and the p-side layer, wherein the n-side layer is positioned above the red emitting MQWs active region and the p-side layer.

12. The full-color LED micro-display of claim 1, wherein the first LED, the second LED, and the third LED are formed above a driver panel via a plurality of pixel bonding pads, wherein the driver panel is a CMOS driving chip, a thin-film transistor (TFT) driving backplane, a gate-in-panel (GIP) circuit, or other driver panels that comprise circuits on a panel substrate.

13. The full-color LED micro-display of claim 12, wherein the dual wavelength MQWs active region is positioned at a lower vertical position closer to the driver panel than the red emitting MQWs active region.

14. The full-color LED micro-display of claim 12, wherein:
   the blue/green dual wavelength LED structure further comprising an n-doped semiconductor layer and a p-doped semiconductor layer;

the monochrome red LED structure further comprising an n-side layer and a p-side layer;

the dual wavelength MQWs active region is sandwiched between the n-doped semiconductor layer and the p-doped semiconductor layer, wherein the n-doped semiconductor layer is positioned above the dual wavelength MQWs active region and the p-doped semiconductor layer; and the red emitting MQWs active region is sandwiched between the n-side layer and the p-side layer, wherein the n-side layer is positioned above the red emitting MQWs active region and the p-side layer.

* * * * *